(12) United States Patent
Sharon et al.

(10) Patent No.: US 8,848,442 B2
(45) Date of Patent: Sep. 30, 2014

(54) MULTI-BIT-PER-CELL FLASH MEMORY DEVICE WITH NON-BIJECTIVE MAPPING

(75) Inventors: Eran Sharon, Rishon Lezion (IL); Idan Alrod, Herzliya (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

(21) Appl. No.: 12/977,097

(22) Filed: Dec. 23, 2010

(65) Prior Publication Data

US 2011/0093652 A1 Apr. 21, 2011

Related U.S. Application Data

(60) Continuation-in-part of application No. 12/612,733, filed on Nov. 5, 2009, now Pat. No. 7,990,766, which is a continuation of application No. 12/045,733, filed on Mar. 11, 2008, now Pat. No. 7,643,342, which is a division of application No. 11/540,560, filed on Oct. 2, 2006, now Pat. No. 7,388,781.

(60) Provisional application No. 60/779,044, filed on Mar. 6, 2006.

(51) Int. Cl.
*G11C 16/04* (2006.01)
*G11C 16/10* (2006.01)
*G11C 16/06* (2006.01)
*G11C 16/34* (2006.01)
*G06F 11/10* (2006.01)
*G11C 7/10* (2006.01)
*G11C 29/24* (2006.01)
*G11C 11/56* (2006.01)

(52) U.S. Cl.
CPC ............ *G06F 11/1072* (2013.01); *G11C 16/34* (2013.01); *G11C 7/1006* (2013.01); *G11C 29/24* (2013.01); *G11C 16/10* (2013.01); *G11C 2211/5641* (2013.01); *G11C 11/5628* (2013.01)
USPC ............. 365/185.09; 365/185.03; 365/185.24

(58) Field of Classification Search
CPC .... G11C 16/10; G11C 16/34; G11C 11/5628; G11C 11/5641; G11C 7/1006; G11C 29/42; G06F 2212/403
USPC ........... 365/185.03, 185.24, 185.09; 711/103, 711/202, E12.008
See application file for complete search history.

(56) References Cited

U.S. PATENT DOCUMENTS 5,301,284 A 4/1994 Estes et al.
5,404,485 A 4/1995 Ban
(Continued)

FOREIGN PATENT DOCUMENTS

EP 1 952 290 B1 8/2008
GB 2407007 A 4/2005
(Continued)

OTHER PUBLICATIONS

R. Gallagher, Information Theory and Reliable Communication, Wiley, New York NY, USA, (1971).
(Continued)

*Primary Examiner* — Ly D Pham
(74) *Attorney, Agent, or Firm* — Alston & Bird LLP

(57) ABSTRACT

To store input data in a plurality of memory cells, a mapping function of bit sequences to physical parameter states of the cells is provided. The cells are programmed, in accordance with the mapping function, to store the input data, in a way that would store uniformly distributed data with a programming state distribution other than any native state distribution of the mapping function. To store input data in a single memory cell, a mapping function of bit sequences to states of a physical parameter of the cell, such that if uniformly distributed data were stored in a plurality of such memory cells then the states of the physical parameter of the cells would be distributed non-uniformly, is provided. The memory cell is programmed to store the input data in accordance with the mapping function.

12 Claims, 13 Drawing Sheets

(56) References Cited

U.S. PATENT DOCUMENTS

| | | |
|---|---|---|
| 5,479,624 A | 12/1995 | Lee |
| 5,541,886 A | 7/1996 | Hasbun |
| 5,621,682 A | 4/1997 | Tanzawa et al. |
| 5,859,858 A | 1/1999 | Leeman |
| 5,930,167 A | 7/1999 | Lee et al. |
| 5,943,693 A | 8/1999 | Barth |
| 6,151,246 A | 11/2000 | So et al. |
| 6,201,838 B1 | 3/2001 | Kim |
| 6,304,657 B1 | 10/2001 | Yokota et al. |
| 6,400,601 B1 | 6/2002 | Sudo et al. |
| 6,469,931 B1 | 10/2002 | Ban et al. |
| 6,522,580 B2 | 2/2003 | Chen et al. |
| 6,643,188 B2 | 11/2003 | Tanaka et al. |
| 6,847,550 B2 | 1/2005 | Park |
| 7,133,311 B2 | 11/2006 | Liu |
| 7,164,601 B2 | 1/2007 | Mitani et al. |
| 7,188,228 B1 | 3/2007 | Chang et al. |
| 7,388,781 B2 | 6/2008 | Litsyn et al. |
| 7,716,415 B2 * | 5/2010 | Sharon ................. 711/103 |
| 7,757,153 B2 | 7/2010 | Hwang et al. |
| 7,911,851 B2 | 3/2011 | Banks |
| 8,085,590 B2 | 12/2011 | Litsyn et al. |
| 2001/0038553 A1 | 11/2001 | Parker et al. |
| 2002/0078419 A1 | 6/2002 | Kuwazoe et al. |
| 2004/0080979 A1 | 4/2004 | Park |
| 2004/0153621 A1 | 8/2004 | Polansky et al. |
| 2005/0057995 A1 | 3/2005 | Mitani et al. |
| 2005/0119988 A1 | 6/2005 | Buch et al. |
| 2006/0010296 A1 | 1/2006 | Dent |
| 2006/0078206 A1 | 4/2006 | Mishima et al. |
| 2006/0139189 A1 | 6/2006 | Sadowsky |
| 2007/0089034 A1 | 4/2007 | Litsyn et al. |
| 2007/0150694 A1 | 6/2007 | Chang et al. |
| 2007/0162236 A1 | 7/2007 | Lamblin et al. |
| 2007/0168637 A1 | 7/2007 | Polansky et al. |
| 2007/0171730 A1 | 7/2007 | Ramamoorthy et al. |
| 2007/0234183 A1 | 10/2007 | Hwang et al. |
| 2007/0252192 A1 | 11/2007 | Mokhlesi et al. |
| 2008/0239829 A1 | 10/2008 | Banks |
| 2008/0291724 A1 | 11/2008 | Litsyn et al. |
| 2009/0029511 A1 | 1/2009 | Wu |
| 2010/0009504 A1 | 1/2010 | Hsu et al. |
| 2011/0093652 A1 | 4/2011 | Sharon et al. |
| 2011/0258370 A1 * | 10/2011 | Sharon et al. ................. 711/103 |
| 2012/0166897 A1 * | 6/2012 | Franca-Neto et al. ........ 714/721 |

FOREIGN PATENT DOCUMENTS

| | | |
|---|---|---|
| JP | 63-308800 A | 12/1988 |
| JP | 6-131881 A | 5/1994 |
| JP | 7-192478 A | 7/1995 |
| JP | H-7-234823 A | 9/1995 |
| JP | 8-007588 A | 1/1996 |
| JP | 8-249893 A | 9/1996 |
| JP | H-10-162503 A | 6/1998 |
| JP | H-10-313275 A | 11/1998 |
| JP | 11-066887 A | 3/1999 |
| JP | H-11-154394 A | 6/1999 |
| JP | 11-176192 A | 7/1999 |
| JP | 11-177070 A | 7/1999 |
| JP | H-11-176193 A | 7/1999 |
| JP | 11-232898 A | 8/1999 |
| JP | 2001-14873 A | 1/2001 |
| JP | 2001-503181 A | 3/2001 |
| JP | 2001-210085 | 8/2001 |
| JP | 2004-517435 A | 6/2004 |
| JP | 2005/275697 A | 10/2005 |
| JP | 2006/114078 A | 4/2006 |
| JP | 2009-512055 A | 3/2009 |
| JP | 2009-512112 A | 3/2009 |
| JP | 2010-055905 A | 3/2010 |
| WO | WO-2006/067791 A2 | 6/2006 |

OTHER PUBLICATIONS

S. Lin and D. J. Costello, Error Control Coding: Fundamentals and Applications, Prentice Hall, Englewood Cliffs NJ USA, 1983.

Y. Nana, E. Sharon and S. Litsyn "Improved Decoding of LDPC Coded Modulations,"IEEE Communication Letters, vol. 10, No. 5 pp. 375-377 (2006).

U. Wachsmann, R.F.H Fischer and J.B. Huber, "Multilevel Codes: Theoretical Concepts and Practical Design Rules" IEEE Transactions on Information Theory Vo. 45 No. 5 pp. 1361-1391 (1999).

G. Cairo, G. Taricco and E. Biglieri, "Bit Interleaved Coded Modulation"; IEEE Transactions on Information Theory Vo. 44 No. 3 pp. 927-946 (1998).

European Search Report from corresponding EP Application No. 06809811.0, dated Sep. 14, 2009.

International Preliminary Report on Patentability for corresponding International Application No. PCT/IL06/01251, issued Mar. 3, 2009.

International Search Report and Written Opinion for corresponding International Application No. PCT/IL06/01251, mailed Jun. 23, 2008.

Office Action from Japanese Application No. 2008-557892 dated Dec. 9, 2011.

Notice of Allowance for U.S. Appl. No. 13/175,859 dated May 16, 2012.

Office Action from Japanese Patent Application No. 2008-557892, dispatched on Jul. 27, 2012.

Office Action for European Application No. 06 809 811.0 dated Apr. 7, 2011.

Office Action for U.S. Appl. No. 13/175,859 dated Nov. 8, 2013.

Office Action for Japanese Application No. 2008-557892; dated Apr. 19, 2013.

Office Action for Japanese Application No. 2012-130948; dated Feb. 22, 2013.

Office Action for Korean Application No. 10-2008-7020296 dated May 11, 2013.

Office Action for Japanese Application No. 2012-130948, dated Aug. 2, 2013.

Office Action for Korean Application No. 10-2008-7020296; dated Feb. 27, 2014.

* cited by examiner

MULTI-BIT-PER-CELL FLASH MEMORY DEVICE WITH NON-BIJECTIVE MAPPING

This patent application is a continuation-in-part of U.S. patent application Ser. No. 12/612,733, filed Nov. 5, 2009, which is a continuation of U.S. patent application Ser. No. 12/045,733, filed Mar. 11, 2008, now U.S. Pat. No. 7,643,342, issued Jan. 5, 2010, which is a divisional application of U.S. patent application Ser. No. 11/540,560, filed Oct. 2, 2006, now U.S. Pat. No. 7,388,781, that claimed the benefit of U.S. Provisional Patent Application No. 60/779,044, filed Mar. 6, 2006

FIELD AND BACKGROUND OF THE INVENTION

The technology described herein relates to the programming of flash memories, especially multi-bit-per-cell flash memories.

A simplified block diagram of a Multi-Bit-Per-Cell (MBPC) flash memory device 10 is shown in FIG. 1. Specifically, the two components of flash memory device 10 that are illustrated in FIG. 1 are a flash controller 12 and a flash memory cell array 18.

Flash controller 12 includes two blocks: an encoder block 14 that translates a stream of information bits that the user wishes to store in flash cell array 18 into a stream of states or voltage levels that should be programmed into the cells of flash cell array 18, and a decoder block 16 that translates a stream of cell states or voltage levels read from flash cell array 18 into the stream of information bits that was stored in flash cell array 18.

The cost of a MBPC Flash system is mainly influenced by the size of the flash memory cell array required in order to store a given amount of information, i.e., the number of flash cells required in order to store a given amount of information. It is convenient to use the number of information bits per flash cell (abbreviated as IBPC) as a normalized measure of the flash memory's cost efficiency:

IBPC=(number of information bits stored in the flash memory)÷(number of cells in the flash memory)

One might argue that the IBPC of a MBPC Flash system can be increased simply by increasing the number of states or voltage levels that can be programmed in a flash cell. However a fair comparison should also take into account the MBPC flash reliability and the MBPC flash performance.

The main criterion of flash reliability is the ability of the controller to recover the stored information with high probability, i.e. with a negligible bit error rate. The states or voltage levels that are programmed into the flash cells are not always equal to the states or voltage levels that are read from the flash cells. This is due to physical processes that occur inside the flash cell array that cause the charge stored in the flash cell to change. These harmful physical processes corrupt the information stored in the flash cells. Usually the flash reliability is a function of time and flash cell wear level. The flash reliability is determined primarily by the following factors:
1. Data retention: the expected amount of time that data can be stored in the flash cells and still be recovered with high reliability.
2. Program/Erase cycles: the expected number of times that the flash cells can be programmed and erased while allowing reliable storage of data.

The main criterion of flash performance is the flash read/write throughput, i.e. the throughput of writing data to the flash memory and reading data from the flash memory, measured in information bits per second.

Unfortunately, increasing the number of voltage levels that can be programmed in each flash cell has a negative effect both on the flash memory reliability and on the flash memory performance. For example, as the number of voltage levels increases, the expected data retention time of the flash memory decreases and the expected number of available program/erase cycles decreases, resulting in a lower flash memory reliability. Moreover, the read/write throughput of the flash memory becomes slower with the increase of the number of flash cell voltage levels. Hence there is a tradeoff between the flash memory cost (the IBPC of the flash memory) and the reliability and performance of the flash memory. Obviously, one wishes to optimize this tradeoff. This can be done through an appropriate design of the flash controller.

A simple conventional flash controller uses a bijective mapping, i.e. a mapping that is one-to-one and onto, in order to directly map k information bits into a state or voltage level out of $q=2^k$ states of each flash cell. By allowing only a small number of states q to be programmed in a cell, the probability of the cell to make a transition out of its state is made negligible, providing a reliable flash memory device. Note that such a flash memory device can use only a number of states q in the cell that is a power of 2 because bits are directly mapped to cell states through a bijective mapping.

U.S. Pat. No. 6,847,550, issued Jan. 25, 2005 to Park and entitled "NONVOLATILE SEMICONDUCTOR MEMORY HAVING THREE_LEVEL MEMORY CELLS AND PROGRAM AND READ MAPPING CIRCUITS THERFOR" (hereinafter "Park '550"), describes a method of trading-off Flash cost and reliability by using a non-bijective mapping, that is one-to-one but not onto, from information bits to the states of one or more flash cells. By using the non-bijective mapping, a number of cell states that is not a power of 2 can be used. In the example described in Park '550, three-state cells are used. This provides higher flash reliability compared to a flash memory device based on four-state cells (due to lower transition probability from state to state) and lower cost compared to a flash memory device based on two-state cells.

U.S. Pat. No. 6,469,931, issued Oct. 22, 2002 to Ban et al. entitled "METHOD FOR INCREASING INFORMATION CONTENT IN A COMPUTER MEMORY" (hereinafter "Ban '931"), provides a general framework for reducing the cost of a flash memory device while maintaining the reliability of the flash memory device. This is done by mapping large blocks of K information bits into large blocks of M cells with q states. The encoder block (e.g. encoder block 14 of FIG. 1) implements a mapping function, also known as an Error Correcting Code (ECC), that maps points from the vector space $2^K$ onto points in the vector space $q^M$. The mapping is not onto, i.e., not all configurations of cell states are used ($2^K < q^M$). The decoder block (e.g. decoder block 16 of FIG. 1) collectively decodes the M read cell states and determines the most probable legitimate configuration of cell states that was stored in the flash memory, which is then used for recovering the K stored information bits. It is well known from information theory and coding theory (R. Gallagher, *Information Theory and Reliable Communication*, Wiley, New York N.Y. USA, 1971) that increasing the dimensionality of the space of possible cell state configurations to which a block of information bits is mapped allows for more efficient storage of information. This way, if a good mapping function or ECC is used, more information bits can be mapped across a given number of flash cells, while the probability of the flash memory to make a transition from one legitimate configuration of states to another is kept arbitrarily small. However, it is not sufficient that the mapping function provide for a high IBPC. The mapping function should also allow low complexity implementation of the encoder and decoder blocks. Coding theory (S. Lin and D. J. Costello, *Error Control Coding: Fundamentals and Applications*, Prentice Hall, Englewood Cliffs N.J. USA, 1983) provides a theoretical basis for designing such good ECCs.

In the example provided in Ban '931, a direct mapping function is used for mapping information bits into configurations of cell states. This method incurs high encoder complexity. A more common low complexity approach, shown in FIG. 2, is to divide encoder block 14 into two parts: 1) a binary ECC encoder block 20 that maps K information bits into N coded bits by adding N-K redundant bits and 2) a simple mapper block 22 that implements a one-dimensional bijective mapping function that maps the N coded bits into M cells by mapping each N/M bits into one of the $q=2^{N/M}$ states of a cell.

Decoder block 16 is also divided similarly into two parts: 1) a simple demapper block 24 that implements a one-dimensional bijective mapping function that maps the M read cell states into N bits by mapping each read cell state into N/M bits, and 2) an ECC decoder block 26 that decodes the N "noisy" bits received from demapper 24 and produces an estimation of the K information bits. An optimal decoder 26 returns the most probable K information bits given the N "noisy" bits.

SUMMARY OF THE INVENTION

One embodiment provided herein is a method of storing input data in a plurality of memory cells, including: (a) providing a mapping function of bit sequences to states of a physical parameter of the cells; and (b) programming the plurality of memory cells, in accordance with the mapping function, to store the input data, in a way that would store uniformly distributed data with a programming state distribution other than any native state distribution of the mapping function.

Another embodiment provided herein is a memory device including: (a) a plurality of cells; and (b) a controller operative to store input data in the plurality of memory cells by programming the plurality of memory cells, in accordance with a mapping function of bit sequences to states of a physical parameter of the cells, to store the input data, in a way that would store uniformly distributed data with a programming state distribution other than any native state distribution of the mapping function.

Another embodiment provided herein is a system for storing input data, including: (a) a memory device that includes a plurality of cells; and (b) a processor operative to store input data in the plurality of memory cells by programming the plurality of memory cells, in accordance with a mapping function of bit sequences to states of a physical parameter of the cells, to store the input data, in a way that would store uniformly distributed data with a programming state distribution other than any native state distribution of the mapping function.

Another embodiment provided herein is a computer-readable storage medium having computer-readable code embodied in the computer-readable storage medium, the computer-readable code for storing input data in a plurality of memory cells, the computer-readable code including program code for programming the plurality of memory cells, in accordance with a mapping function of bit sequences to states of a physical parameter of the cells, to store the input data, in a way that would store uniformly distributed data with a programming state distribution other than any native state distribution of the mapping function.

Another embodiment provided herein is a method of storing input data in a single memory cell, including: (a) providing a mapping function of bit sequences to states of a physical parameter of the cell such that if uniformly distributed data were stored in a plurality of the memory cells then the states of the physical parameter of the cells would be distributed non-uniformly; and (b) programming the memory cell to store the input data in accordance with the mapping function.

Another embodiment provided herein is a memory device including: (a) at least one memory cell; and (b) a controller operative to store input data in a single one of the at least one memory cell in accordance with a mapping function, of bit sequences to states of a physical parameter of the cell, such that if uniformly distributed data were stored in a plurality of such memory cells then the states of the physical parameter of the plurality of memory cells would be distributed non-uniformly.

Another embodiment provided herein is a system for storing input data including: (a) a memory device that includes at least one memory cell; and (b) a processor operative to store input data in a single one of the at least one memory cell in accordance with a mapping function, of bit sequences to states of a physical parameter of the cell, such that if uniformly distributed data were stored in a plurality of such memory cells then the states of the physical parameter of the plurality of memory cells would be distributed non-uniformly.

Another embodiment provided herein is a computer-readable storage medium having computer-readable code embodied in the computer-readable storage medium, the computer-readable code for storing input data, the computer-readable code including program code for storing the input data in a single memory cell in accordance with a mapping function, of bit sequences to states of a physical parameter of the cell, such that if uniformly distributed data were stored in a plurality of such memory cells then the states of the physical parameter of the plurality of memory cells would be distributed non-uniformly.

According to a basic method for storing input data in a plurality of memory cells, a mapping function of bit sequences to states of a physical parameter of the cells is provided. Typically, as in the preferred embodiments below, the physical parameter is a threshold voltage of the cells. In the preferred embodiments below, the states of the physical parameter are voltage levels. The cells are programmed, in accordance with the mapping function, to store the input data in a way that would store uniformly distributed data with a programming state distribution other than any native state distribution of the mapping function.

It is assumed that the states are ordered and that all the cells start in their lowest state prior to programming. If the lowest state is a state that represents data, which is usually the case in the case of the cells being flash memory cells, then "programming" a cell to store the bit sequence corresponding to the lowest state means doing nothing to the cell.

Preferably, the programming of the plurality of cells to store the input data includes transforming the input data into transformed data, using a transformation that would transform uniformly distributed data into transformed uniformly distributed data that would be stored, by programming a sufficiently large number of the memory cells in accordance with the mapping function, with the programming state distribution, and then programming the plurality of memory cells to store the transformed data in accordance with the mapping function. Note that "transformed uniformly distributed data" are not the same as "uniformly distributed transformed data (the adjectives do not commute). Transformed uniformly distributed data are not necessarily uniformly distributed, and indeed are almost never uniformly distributed. Most preferably, the method also includes determining the programming state distribution, for example by selecting a target state distribution and devising the transformation, for example using reverse Huffman encoding, so that the programming state distribution approximates the target state distribution within a predetermined tolerance.

Preferably, the programming state distribution is biased downward relative to every native state distribution of the mapping function.

Preferably, the programming of the plurality of cells to store the input data includes programming the plurality of memory cells, in accordance with a pre-mapping relative to the mapping function, to initially store only a portion of the input data, in a way that would store a corresponding portion of the uniformly distributed data with a programming state distribution other than any native state distribution of the pre-mapping. Then the plurality of memory cells is programmed to store the rest of the input data.

One option for storing the rest of the input data is to store the rest of the input data in a way that would have resulted in the uniformly distributed data being stored with a native state distribution of the mapping function if the portion of the uniformly distributed data that corresponds to the initially programmed portion of the input data had been stored with a native state distribution of the pre-mapping. For example, initially programming the most significant bits of uniformly distributed two-bit data according to the native voltage level distribution of the pre-mapping of Table 8 below produces a voltage level state distribution of (0.5, 0, 0.5, 0). Then programming the least significant bits of the uniformly distributed two-bit data by leaving cells that are supposed to store the bit patterns "0 0" and "1 1" at their present voltage level and boosting cells that are supposed to store the bit patterns "0 1" and "1 0" up one voltage level, without applying reverse Huffman encoding to the least significant bits, produces a voltage level distribution of (0.25, 0.25, 0.25, 0.25) which is the native voltage level distribution of the mapping function of Table 1 below.

Another option for storing the rest of the input data is to store the rest of the input data in a way that would have resulted in the uniformly distributed data being stored with a programming state distribution other than any native state distribution of the mapping function if the portion of the uniformly distributed data that corresponds to the initially programmed portion of the input data had been stored with a native state distribution of the pre-mapping. For example, initially programming the most significant bits of uniformly distributed two-bit data according to the native voltage level distribution of the pre-mapping of Table 8 below produces a voltage level state distribution of (0.5, 0, 0.5, 0). Then programming the least significant bits of the uniformly distributed two-bit data by leaving cells that are supposed to store the bit patterns "0 0" and "1 1" at their present voltage level and boosting cells that are supposed to store the bit patterns "0 1" and "1 0" up one voltage level, after applying reverse Huffman encoding to the least significant bits that results in a fraction $\alpha \neq 0.5$ of the encoded least significant bits being "1"s and a fraction $1-\alpha$ of the encoded least significant bits being "0"s, produces an overall voltage level distribution that is not the native voltage level distribution of the mapping function of Table 1 below.

According to a basic method of storing input data in a single memory cell, a mapping function of bit sequences to states of a physical parameter of the cell, such that if uniformly distributed data were stored in a plurality of the memory cells then the states of the physical parameter of the cells would be distributed non-uniformly, is provided. Then the memory cell is programmed to store the input data in accordance with the mapping function. Typically, as in the preferred embodiments below, the physical parameter is a threshold voltage of the cells. In the preferred embodiments below, the states of the physical parameter are voltage levels. As noted below, the mapping function of Table 2 below is one such mapping function.

One option, under this method, is to program the memory cell, in accordance with a pre-mapping relative to the mapping function, to initially store only a portion of the input data in a way that would store a corresponding portion of the uniformly distributed data in the plurality of the memory cells with a non-uniform distribution of the states of the physical parameter of the cells. Then the memory cell is programmed to store the rest of the input data in accordance with the mapping function.

Another option is to select a target distribution of the states of the physical to parameter of the cell, and to devise the mapping function so that if the uniformly distributed data were stored in the plurality of the memory cells then the states of the physical parameters of the cells would be distributed according to the target distribution.

The scope of the appended claims also includes memory devices and systems for implementing the methods described and claimed herein. The scope of the appended claims also includes computer-readable storage media having embodied thereon computer-readable code for implementing the methods described and claimed herein.

BRIEF DESCRIPTION OF THE DRAWINGS

Various embodiments are described herein, by way of example only, with reference to the accompanying drawings, wherein.

DESCRIPTION OF THE PREFERRED EMBODIMENTS

Figure 1:
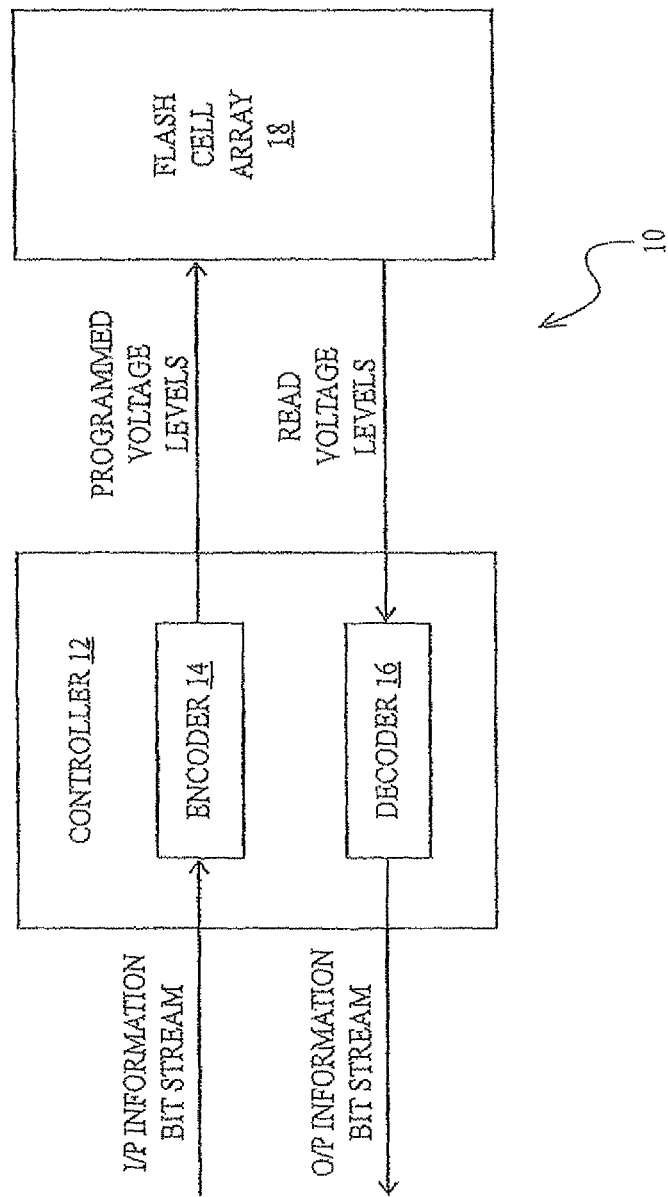
FIG. 1 is a simplified block diagram of a conventional MBPC flash memory device.
Figure 2:
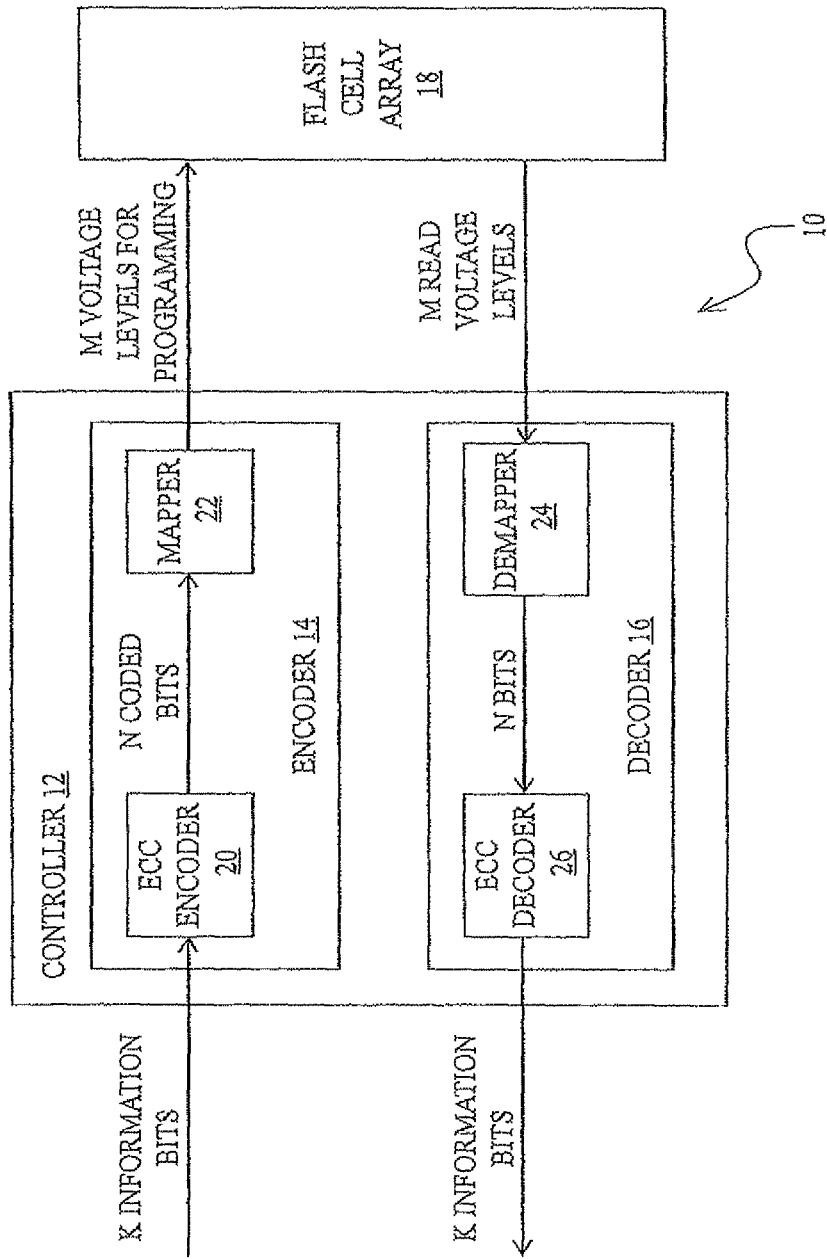
FIG. 2 is a simplified block diagram of one variant of the conventional MBPC flash memory device of FIG. 1.

The principles and operation of flash memory programming according to the technology summarized above may be better understood with reference to the drawings and the accompanying description.

A flash controller of the technology described herein uses a combination of an ECC and a low dimensional non-bijective mapping, providing a low complexity solution for achieving an optimal tradeoff among flash cost, reliability and performance. Moreover a flash controller of the technology described herein provides very high flexibility in the design of a flash system, supporting any number of states or voltage levels in a flash cell, not necessarily a power of 2. The combination of an ECC and a non-bijective mapper allows for designing a low-complexity optimal solution for a given MBPC flash technology and given performance, cost and/or reliability requirements. More specifically, For a given Flash reliability, a flash controller of the technology described herein provides lower flash cost and/or higher flash performance, compared to conventional controllers.

For a given flash cost, a flash controller of the technology described herein provides better flash reliability and/or higher flash performance, compared to conventional controllers.

For a given flash performance, a flash controller of the technology described herein provides lower flash cost and/or better flash reliability, compared to conventional controllers.

A controller of the technology described herein uses a non-bijective mapper, i.e. a mapper whose mapping is either not one-to-one, or not onto, or neither one-to-one nor onto. Moreover, the mapping is low dimensional but not necessarily one dimensional, i.e. the mapping can be performed to several cells and not necessarily to only a single cell. The non-bijective mapping allows for using a number of voltage levels in a cell that is not a power of 2. The non-bijective mapping also allows for inducing unequal probabilities over the programmed states or voltage levels of a cell. The added degrees of freedom can be used to optimize the flash memory device's characteristics.

Let $f$ denote the non-bijective mapping function used according to the technology described herein. $f$ is a mapping from length k binary sequences into length m q-ary sequences, i.e. $f: 2^k \rightarrow q^m$. Because $f$ is non-bijective, $2^k \neq q^m$. Thus if $f$ is not one-to-one (but is onto) then $2^k > q^m$ and if $f$ is not onto (but is one-to-one) then $2^k < q^m$. We refer herein to a length m q-ary sequence as a configuration. A configuration is stored or programmed into m cells with q states. We refer herein to the configurations that are mapped by $f$ as legitimate configurations.

In the discussion below we need to use a measure of the probability of an undesired transition from one state to another. In flash memory cells it is typically the case that the closer together the threshold voltage ranges of two states are, the higher the probability of transition between the two states. Therefore the term "adjacent states" is used herein to refer to states that are adjacent on the threshold voltage axis. In other words, two states are adjacent to each other if and only if there is no other state of the cell whose threshold voltage falls between the threshold voltages of those two states. This definition also implies that we take adjacency to be a reflexive relation—if $S_1$ is adjacent to $S_2$ then $S_2$ is adjacent to $S_1$.

Note—in the above discussion we are assuming the flash memory cells are of the "conducting floating gate" type, where all the states of a cell differ only in their threshold voltage level. There are flash memory technologies that use a non-conducting floating gate—examples are NROM memories from Saifun Semiconductors of Netanyah, Israel and MirrorBit memories from Spansion Inc. of Sunnyvale Calif. USA. In such flash memories a cell's states correspond to a combination of multiple (typically two) values of threshold voltages, caused by electric charges residing in multiple places in the gate, that together represent the cell's state. For the purpose of the technology described herein such flash cells are considered as separate multiple cells, with each electric charge defining a separate threshold voltage with its own concept of "adjacent states". So for example an NROM cell having two electric charges in two opposite edges of the gate, each of the charges capable of being put into four different states (thus supporting the storage of 4 bits in a cell), is considered for the purpose of the technology described herein to be equivalent to two cells each capable of storing two bits.

We say that two configurations $Q_1$ and $Q_2$ are adjacent configurations if the two configurations differ only in the state of a single cell and the two different states of the cell are adjacent. In other words, the two configurations are adjacent if the two configurations differ only in the state of the i'th cell such that in one configuration the state of the i'th cell is $S_1$ and in the other configuration the state of the i'th cell is $S_2$ and the state $S_2$ is adjacent to state $S_1$.

We say that a one-to-one mapping $f$ is a generalized Gray mapping if for any two legitimate adjacent configurations $Q_1$ and $Q_2$ the binary sequences $f^{-1}(Q_1)$ and $f^{-1}(Q_2)$ differ only in a single bit.

In some embodiments of the technology described herein it is desirable to use a generalized Gray mapping in the controller because a generalized Gray mapping minimizes the bit error rate. Probable transitions in the states of cells in the flash memory result in a small number of erroneous bits which can be corrected by an ECC with high probability.

According to one embodiment of the technology described herein the controller employs a mapping that is not one-to-one. It is desirable to use a mapping that minimizes the expected bit error rate. By combining this non-bijective mapping with an appropriate ECC one can optimize the flash device's cost vs. reliability vs. performance tradeoff.

According to another embodiment of the technology described herein the controller employs a generalized Gray mapping that is not onto. By combining this non-bijective mapping with an appropriate ECC one can optimize the flash memory device's cost vs. reliability vs. performance tradeoff.

According to yet another embodiment of the technology described herein, the controller employs a mapping that is neither one-to-one nor onto. By combining this non-bijective mapping with an appropriate ECC, one can optimize the flash memory device's cost vs. reliability vs. performance tradeoff.

Conventional controllers use a one-dimensional bijective mapper, i.e. a mapper that uses a one-to-one mapping of binary sequences into all possible voltage levels of a single cell. Thus, a conventional controller can only use a number of programming voltage levels that is a power of 2. Furthermore, a conventional controller employs equal probabilities over the cell voltage levels when random data are written to the flash memory. In other words, assuming each information bit written to the flash memory has equal probability to be 0 or 1, the probability of programming every voltage level in a flash cell by the flash controller is equally likely.

Unlike the conventional controller, a controller of the technology described herein uses a non-bijective mapper, i.e. a mapper whose mapping is either not one-to-one, or not onto, or neither one-to-one nor onto. Moreover, the mapping is low dimensional but not necessarily one-dimensional, i.e. mapping can be performed to several cells and not necessarily to only a single cell. The non-bijective mapping allows for using a number of voltage levels in a cell that is not a power of 2. The non-bijective mapping also allows for inducing unequal probabilities over the programmed states or voltage levels of a cell.

These added degrees of freedom can be used to optimize the flash memory device's characteristics.

A mapping that is not onto is also used in Park '550. However the mapping used in Park '550 is not a generalized Gray mapping.

For a given flash technology and a given required flash reliability, there is an upper bound on the number of information bits that can be stored in a flash memory of a given size by a given flash controller, i.e. an upper bound on the achievable IBPC of the flash device. We refer herein to this upper bound on the IBPC of a flash device as the flash capacity of the device.

The flash capacity for a given flash reliability can be computed using tools from information theory, if the physical model of the flash technology is known. More specifically, one needs to know the probability of reading each voltage level assuming that a given voltage level was programmed in the cell. The method of computing the capacity of the flash memory is described in Annex A. Moreover, information theory also assures that the flash capacity can be achieved if controller complexity is not limited. This can be done by using random ECCs of increasing length for protecting the Flash data. The complexity of encoding and decoding such codes using the flash controller is extremely high. However, by using practical coding techniques with low encoding and decoding complexity one can approach the flash capacity. For these reasons we use the flash capacity for comparing efficiency and optimality of various flash devices.

Based on information theoretic considerations one can see that for a given flash technology and flash reliability there is an optimal number of voltage programming levels that should be used. Furthermore, there is an optimal probability distribution that should be used over the voltage levels. For this number of voltage levels and probability distribution over the levels, the flash capacity is maximized. Hence, using this number of voltage levels in the flash memory device is desirable, because using this number of voltage levels minimizes the flash cost for the given flash reliability. Usually, the optimal number of voltage levels is not a power of 2 and the optimal probability distribution over the voltage levels is not uniform.

Alternatively, it can be the case that there exists a minimal number of voltage levels such that using more voltage levels provides only a negligible increase in the flash capacity. In this case using the minimal number of voltage levels provides the best tradeoff between flash cost and reliability to flash performance. In other words using the minimal number of voltage levels maximizes the flash write/read throughput while maintaining the same flash cost and reliability.

For example, consider the following simplified model of a flash memory: Let X denote the programmed voltage level of a flash cell and let Y denote the read voltage level of the flash cell. Assume that the programming and the read voltage levels are identical to each other and constant (not time varying). Assume the flash cell is limited to a voltage window of 1 [Volt]. Furthermore, assume that Y=X+N, where N is an additive white Gaussian noise (modeling the physical processes in the flash cell). The noise N is a random variable normally distributed with expectation $\mu=0$ and a standard deviation of $\sigma=150$ [mV]. Under this simplified flash model that is not time varying, there is no meaning to data retention and program/erase cycles, hence we define the flash capacity as an upper bound on the achievable IBPC allowing reliable storage of information, i.e. negligible bit error rate.

Assuming that the flash controller employs equal probabilities over the programming voltage levels (i.e. that each voltage level in the cell is equally likely to be programmed given that the information written to the Flash is random) then:

Using 2 programming voltage levels results in a flash capacity of 0.9946 information bits per cell (IBPC=0.9946).

Using 3 programming voltage levels results in a flash capacity of 1.2169 information bits per cell (IBPC=1.2169).

Using 4 programming voltage levels results in a flash capacity of 1.1612 information bits per cell (IBPC=1.1612).

Figure 3:
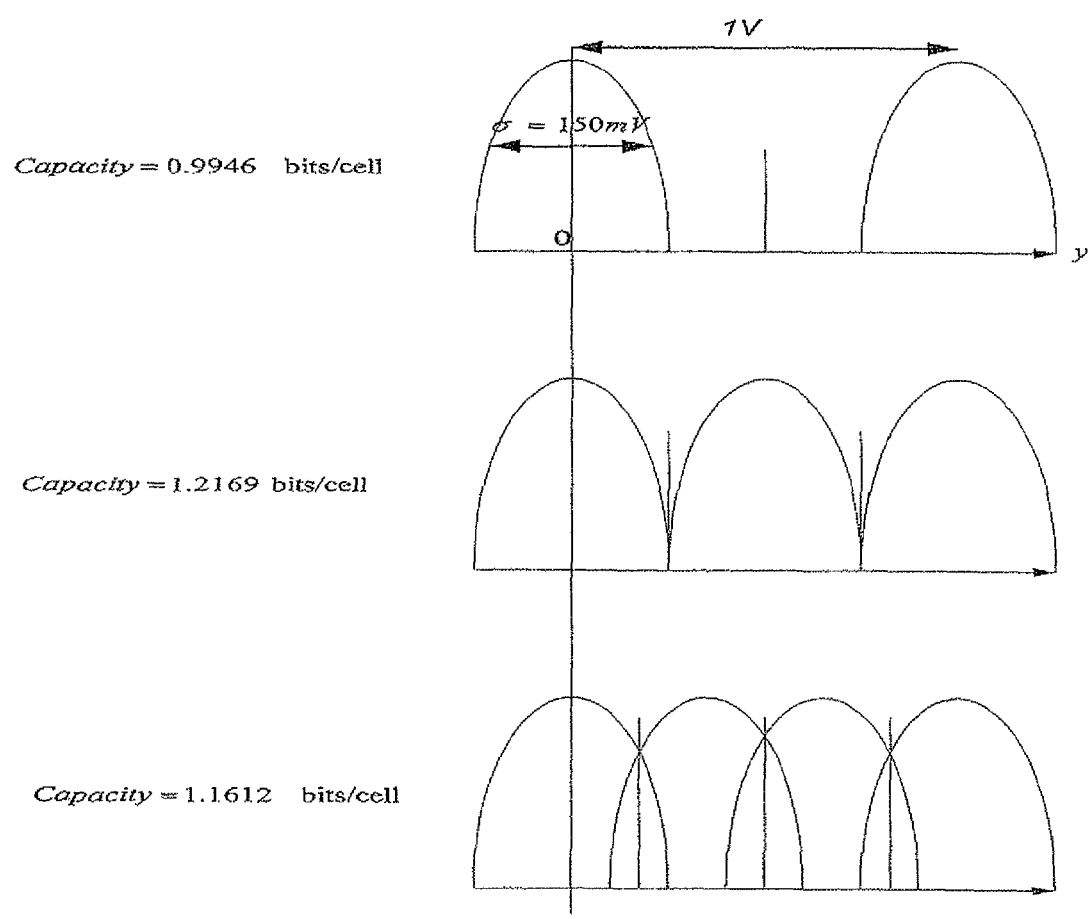
FIG. 3 is a sketch of various threshold voltage distributions, labeled with corresponding capacities.

Returning now to the drawings, FIG. 3 is a sketch of the corresponding threshold voltage distributions. The abscissas in FIG. 3 are threshold voltages. See Annex A for a detailed description of how the capacities of FIG. 3 are computed.

Even higher Flash capacity can be achieved if the controller employs unequal distribution over the voltage levels. The capacity of the flash memory of the simplified model is maximized if 3 programming voltage levels are used and if the middle voltage level is programmed with probability of 28% while the two outer voltage levels are programmed with probability of 36% each. In this case the flash capacity is 1.2245 information bits per cell (IBPC=1.2245). The intuitive explanation for this is that the middle programming voltage level is twice as likely to be read in error (i.e. to be read at a different read level from the programming level) compared to the outer voltage levels. Hence by reducing the programming probability of the middle level we reduce the overall probability of voltage level error. One way to employ the unequal probability over the cell voltage levels requires the flash controller to add some redundant bits. However due to the reduced error probability the controller requires fewer redundant bits in order to allow reliable storage of information in the flash memory. Overall, the total number of redundant bits (the ones used for employing unequal probability and the ones used for protecting the data from errors) is reduced, resulting in higher flash capacity.

In the context of the simplified model, a flash controller of the technology described herein allows for using 3 voltage levels and can employ the optimal probability distribution over the voltage levels. What do we gain compared to the conventional controller which uses 4 voltage levels with equal probability?

1. We gain reduced flash cost: for storing the same amount of information: flash size is reduced by 5.17% ($IBPC_{conventional\ controller}/IBPC_{present\ technology}$=1.1612/1.2245=0.9483).
2. We gain improved flash performance: using 3 programming voltage levels instead of 4, resulting in higher read/write flash throughput.

Figure 4:
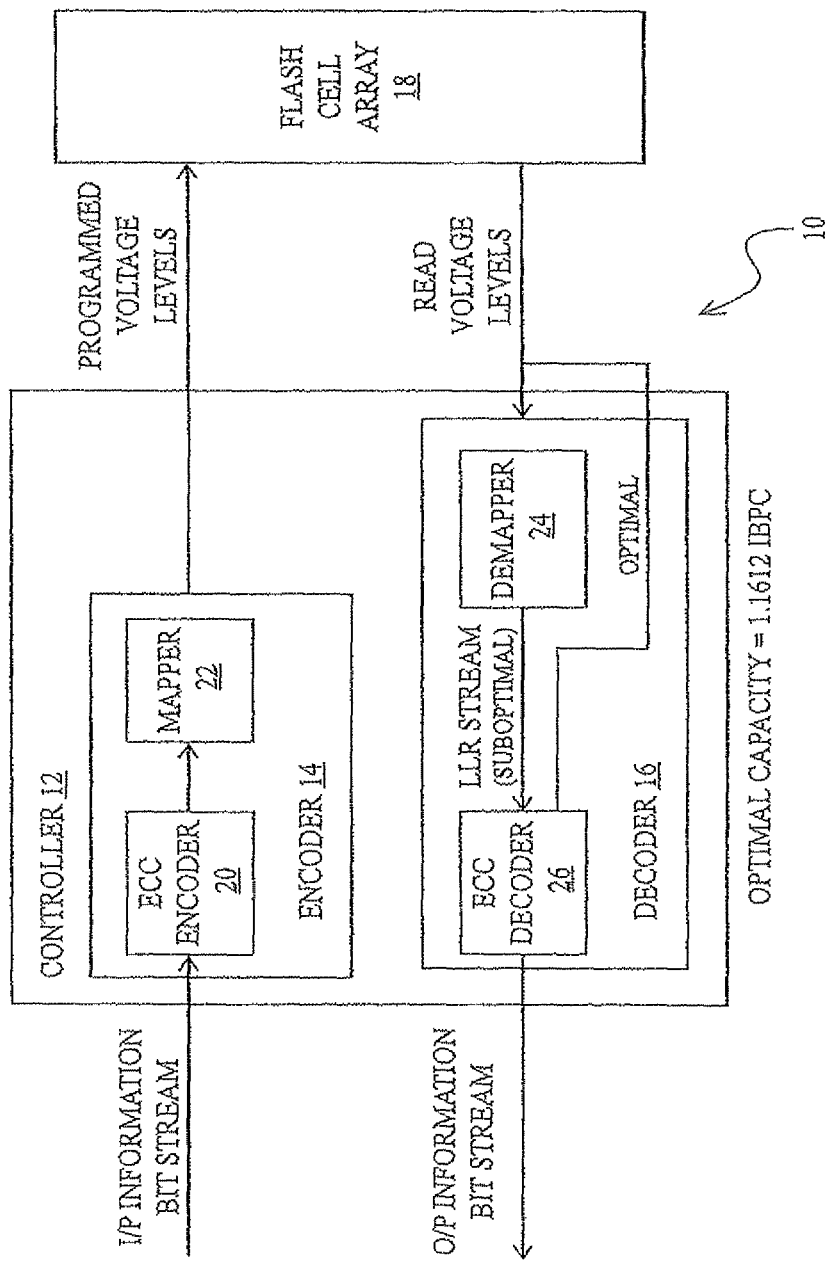
FIG. 4 is FIG. 2 specialized to the third threshold voltage distribution of FIG. 3.

FIG. 4 shows an implementation of conventional flash memory device 10 using 4 equal probability programming voltage levels. Flash controller 12 includes the following blocks:

1. Error Correction Code (ECC) layer:

ECC encoder 20: encodes a stream of information bits into a stream of coded bits. The rate of the ECC is the ratio of the information bits to the coded bits. For example, an ECC based on a binary linear block code maps blocks of K information bits into blocks of N coded bits, where N>K. The ECC rate is R=K/N. In the example shown in FIG. 4 we assume that a binary linear block code is used.

ECC decoder 26: decodes the "noisy" coded bit stream and produces an estimation of the information bits stream. The "noisy" coded bit stream is the original coded bit stream with some of its original symbols (or bits in the case of a binary code) flipped into different symbols. For example a decoder 26 for a binary linear block code receives a "noisy" block of N coded bits (a.k.a "noisy" codeword) and decodes the "noisy" block, producing an estimation of the block of K information bits. Improved correction capability of decoder 26 can be achieved if "soft" estimates of the coded bits are provided to decoder 26 and "soft" decoding is performed. "Soft" decoding can be performed if information on the probabilities of the bits to be erroneous is utilized by decoder 26 in the decoding process. A "soft" estimate of a bit b can be given is various ways. Two common ways are: 1) providing the a-priori probability of the bit b to be 1 given the voltage level's y read from the flash memory, $Pr(b=1|y)$. 2) providing an a-priori Log Likelihood Ratio (LLR) for the bit b given the voltage level/s y read from the flash memory, LLR $\log(Pr(b=0|y)/Pr(b=1|y))$. An explanation of how to compute a-priori LLRs is given in Annex C. In the example shown in FIG. 4 we assume a "soft" decoder 26 is used and the flash capacity is computed accordingly.

2. Mapping/Demapping layer:

Mapper 22: maps a stream of coded bits into a stream of voltage levels that are to be programmed into the flash cells. According to conventional technology, mapper 22 employs a bijection mapping function, i.e. a function that is one-to-one (injective) and onto (surjective). See Annex B for the formal definitions of bijective, injective and surjective functions.

Demapper 24: maps a stream of voltage levels read from flash cell array 18 into a stream of bits, or into a stream of "soft" estimates of bits in case a "soft" decoder is used. Actually, demapper 24 is not essential. Various coding schemes can be used, some with a demapper and some which operate directly on the read voltage levels as described below. In the example shown in FIG. 4 we show both schemes: with and without demapper 24.

Table 1 shows the map from bit sequence to voltage level that is used by controller 12 of FIG. 4.

TABLE 1

| Bit Sequence | Voltage Level |
|---|---|
| 0 0 | 0 |
| 0 1 | 1 |
| 1 1 | 2 |
| 1 0 | 3 |

In order to approach the theoretical flash capacity, an optimal coding scheme should be used. Two such coding schemes are:

1 Single-Level Coding (SLC) with optimal Maximum-Likelihood (ML) decoding: in this scheme the entire information bit stream is encoded by a single code, and decoded using an optimal ML decoder. An ML decoder computes the most likely information bit stream directly from the voltage levels that were read from flash cell array. An optimal decoder usually incurs high decoding complexity. A detailed explanation of the optimal SLC scheme is provided in Annex D. The optimal SLC coding scheme is represented in FIG. 4 as the arrow that bypasses demapper 24.

2. Multi-Level Coding (MLC) with Multi-Stage Decoding (MSD): in this scheme the information bit stream is divided into several streams and each bit stream is encoded using a different code. Decoding is performed in stages, where in each stage a single coded bit stream is decoded using a "soft" decoder that operates on "soft" bit estimates provided by the demapper. The decoding result of each coded bit stream is used by the demapper in order to compute the "soft" bit estimates of the next coded bit stream. A detailed explanation of the optimal MLC/MSD scheme is provided in Annex E.

It is very common to use SLC schemes that are based on suboptimal decoding. The suboptimal decoding does not operate directly on the voltage levels read from the flash cell array, but rather on the "soft" bit estimates provided by the demapper. Because the demapper estimates are based only on first order statistics, some information is lost and decoding is not optimal. However, such schemes require lower implementation complexity and in many cases result only in negligible performance loss as a generalized Gray mapping can be found and used. A detailed explanation of a suboptimal SLC scheme is provided in Annex D. Such a suboptimal SLC scheme is represented in FIG. 4 as the arrows from flash cell array 18 to demapper 24 and from demapper 24 to ECC decoder 26.

We measure the cost of a flash memory device by the capacity of the memory device, i.e. by the achievable flash memory device IBPC. In the example shown in FIG. 4, the capacity of the conventional flash memory device based on an optimal coding scheme is 1.1612 IBPC (See Annex A). In order to approach this Flash capacity a good ECC of rate 1.1612/2=0.5806 should be used.

Figure 5:
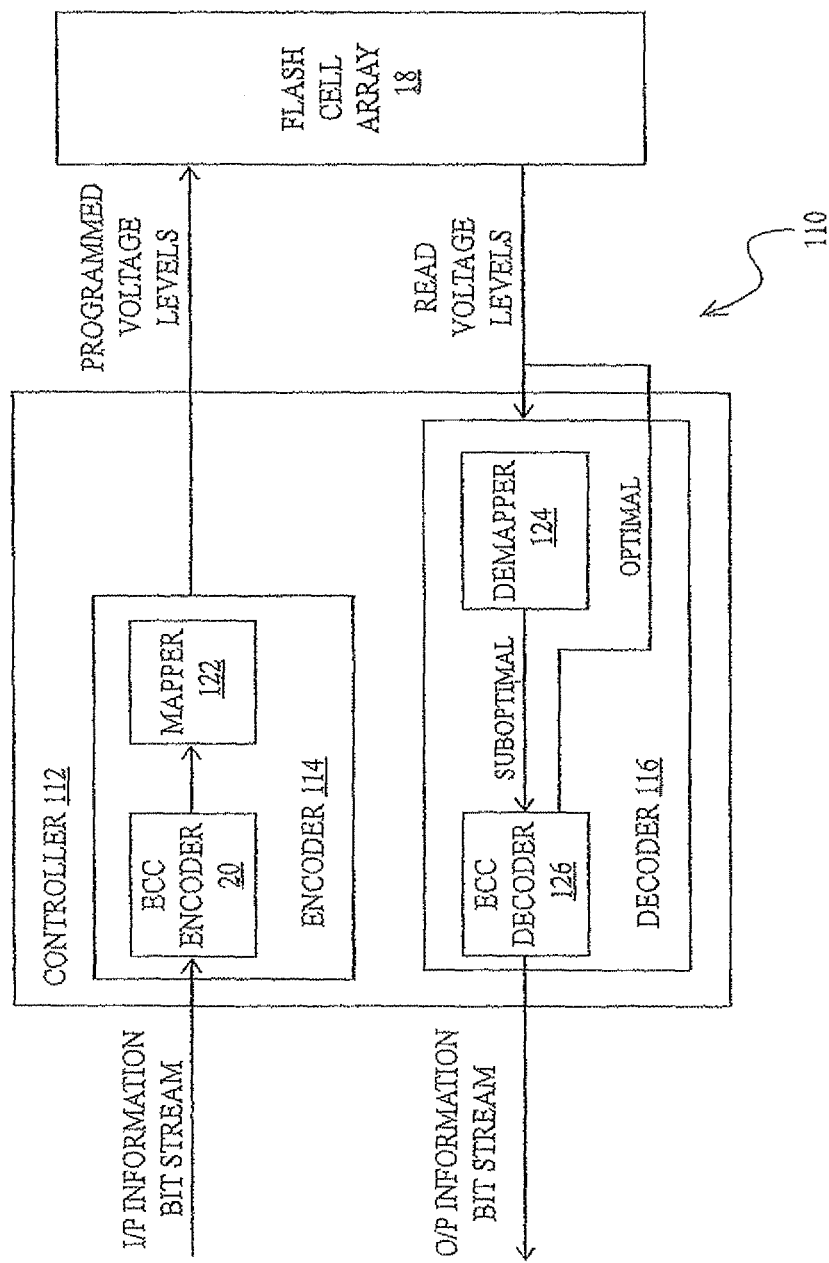
FIG. 5 is a simplified block diagram of a MBPC flash memory device.

FIG. 5 is a simplified block diagram of a MEPC flash memory device 110 of the technology described herein. Specifically, flash memory device 110 is flash memory device 10 of FIG. 4 as modified according to the technology described herein. Like flash memory device 10, flash memory device 110 includes a flash controller 112, and a flash cell array 18 that is inherited from device 10. Flash controller 112 includes an encoder 114 and a decoder 116. Encoder 114 includes ECC encoder block 20 of device 10 and a mapper block 122 of the technology described herein. Decoder 116 includes a demapper block 124 of the technology described herein and a ECC decoder block 126 of the technology described herein. Unlike conventional mapper block 22, mapper block 122 of the technology described herein employs a mapping function that is not a bijection function. The mapping function of the technology described herein is either not one-to-one (infective), in the first embodiment of the technology described herein discussed below, or not onto (surjective), in the second embodiment of the technology described herein discussed below. This allows for designing a flash memory device using any arbitrary number of voltage levels (which is not necessarily a power of 2) and any arbitrary probability distribution over the programming voltage levels. This additional freedom in designing the flash memory device 110 allows designing a more efficient flash memory device providing a better tradeoff between flash cost, reliability and performance. Moreover, in the second embodiment of the technology described herein discussed below, a generalized Gray mapping is used. This reduces the expected bit error rate at the input of ECC decoder 126. It allows for a very simple implementation of controller 112 using a suboptimal SLC coding scheme with negligible loss of efficiency in flash memory device 110, i.e. negligible reduction in the capacity of flash memory device 110. In the first embodiment of the technology described herein discussed below we also use a mapping that minimizes the expected bit error rate at the input of ECC decoder 126.

Tables 2 and 3 show a mapping function and a soft demapping of an instance of the first embodiment of the technology described herein in which only three programming levels are used. The mapping function is not one-to-one (not infective). Due to the use of an ECC we can recover the information bits even though the mapping is not one-to-one. For example if a SLC coding scheme with a "soft" demapper and a "soft" decoder is used, as shown in Table 3, then when voltage level 2 is read, demapper 124 provides a-priori estimates of the bits that were mapped to voltage level 2. The first bit is 1 with high probability, represented by $LLR_1 = \log(Pr(b_1=0|y)/Pr(b_1=1|y)) = -5.3$. For the second bit there are almost equal probabilities to be 1 or 0. Actually it is slightly more likely that the second bit is 1 since if we read voltage level 2 it is slightly more likely that the programmed level was 2 or 1 than it was 2 or 0, that is, $$Pr(\text{program level}=2 \text{ or } 1 | \text{read level}=2) > Pr(\text{program level}=2 \text{ or } 0 | \text{read level}=2)$$

Computing the exact probabilities based on the Flash model we get:

$$LLR_2 = \log(Pr(b_2=0|y)/Pr(b_2=1|y)) = -0.1.$$

For more details on how LLRs are computed see Annex C. The soft decoder takes into account all these "soft" bit estimates and returns the most probable information bit stream that was stored in flash array 18.

The mapping of Table 2 results in a probability distribution of (0.25 0.25 0.5) over the three programming voltage levels. The capacity of flash memory device 110 using the mapping function of Table 2 and the soft demapping of Table 3 and based on an optimal coding scheme is 1.166 IBPC (See Annex A). In order to approach this flash capacity a good ECC of rate 1.166/2=0.583 should be used. The capacity is quite similar to the capacity of flash memory device 10 of FIG. 4. However, this instance of flash memory device 110 uses only 3 voltage levels compared to 4 voltage levels of conventional flash memory device 10, resulting in higher read/write throughput.

TABLE 2

| Bit Sequence | Voltage Level |
|---|---|
| 0 0 | 0 |
| 0 1 | 1 |
| 1 1 | 2 |
| 1 0 | 2 |

TABLE 3

| Voltage Level | LLR Sequence | |
|---|---|---|
| 0 | 20.7 | 4.3 |
| 1 | 3.3 | −3.3 |
| 2 | −5.3 | −0.1 |

Tables 4 and 5 show a mapping function and a soft demapping of another instance of the first embodiment of the technology described herein in which three programming levels are used. The mapping function is not one-to-one (not injective). This mapping function results in a probability distribution of (0.375 0.25 0.375) over the three programming voltage levels. The capacity of Flash memory device 110 using the mapping function of Table 4 and the soft demapping of Table 5 and based on an optimal coding scheme is 1.2224 IBPC (see Annex A). In order to approach this flash capacity a capacity approaching ECC of rate 1.2224/3=0.4075 should be used. The capacity of flash memory device 110 based on this optimal coding scheme is higher than the capacity of conventional flash memory device 10 of FIG. 4, resulting in lower flash cost by ~5%. Moreover, this instance of flash memory device 110 uses only 3 voltage levels compared to 4 voltage levels of conventional Flash memory device 10, resulting in higher read/write throughput.

TABLE 4

| Bit Sequence | Voltage Level |
|---|---|
| 0 0 0 | 0 |
| 0 0 1 | 0 |
| 0 1 1 | 0 |
| 0 1 0 | 1 |
| 1 1 0 | 1 |
| 1 1 1 | 2 |
| 1 0 1 | 2 |
| 1 0 0 | 2 |

TABLE 5

| Voltage Level | LLR Sequence | | |
|---|---|---|---|
| 0 | 5.9 | 0.9 | −09. |
| 1 | 0 | −3.3 | 3.3 |
| 2 | −5.9 | 0.9 | −0.9 |

Tables 6 and 7 show a mapping function and a soft demapping of the second embodiment of the technology described herein in which three programming levels are used. Each sequence of 3 coded bits is mapped into 2 programming voltage levels that are programmed into 2 flash cells. Thus, the mapping function of Table 6 is not surjective. The capacity of Flash memory device 110 using the mapping function of Table 6 and the soft demapping of Table 7 and based on optimal coding scheme is 1.1987 IBPC (See Annex A). In order to approach this flash capacity using optimal and suboptimal coding schemes, capacity approaching ECCs of rate 1.1987/(3 bits/2 cells)=0.7991 should be used. The capacity of flash memory device 110 based on this optimal coding scheme is higher than the capacity of conventional flash memory device 10 of FIG. 4, resulting in lower flash cost by ~3.1%. Moreover, this embodiment of flash memory device 110 uses only 3 voltage levels compared to 4 voltage levels of conventional flash memory device 10, resulting in higher read/write throughput.

TABLE 6

| Bit Sequence | Voltage Level |
|---|---|
| 0 0 0 | 0, 0 |
| 0 0 1 | 0, 1 |
| 0 1 1 | 0, 2 |
| 0 1 0 | 1, 2 |
| 1 1 0 | 2, 2 |
| 1 1 1 | 2, 1 |
| 1 0 1 | 2, 0 |
| 1 0 0 | 1, 0 |

TABLE 7

| Voltage Levels | LLR Sequence | | |
|---|---|---|---|
| 0, 0 | 4.4 | 21.7 | 4.4 |
| 0, 1 | 8.7 | 4.2 | −4.2 |
| 0, 2 | 21.7 | −4.4 | −4.4 |
| 1, 0 | −4.2 | 8.7 | 4.2 |
| 1, 1 | 0 | 0 | 0 |
| 1, 2 | 4.2 | −8.7 | 4.2 |
| 2, 0 | −21.7 | 4.4 | −4.4 |

TABLE 7-continued

| Voltage Levels | LLR Sequence | | |
|---|---|---|---|
| 2, 1 | −8.7 | −4.2 | −4.2 |
| 2, 2 | −4.4 | −21.7 | 4.4 |

Figure 6:
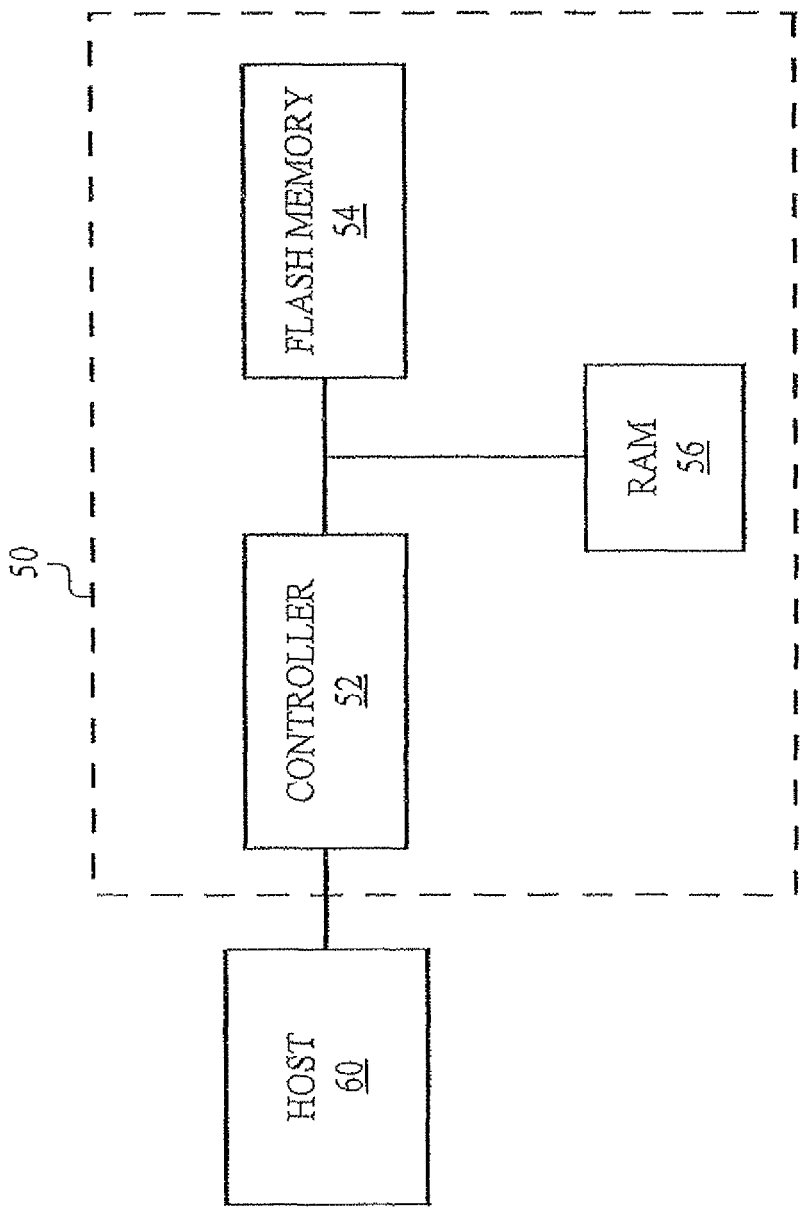
FIG. 6 is a high-level block diagram of a flash memory device of the present invention coupled to a host.

FIG. 6 is a high-level block diagram of a flash memory device 50 of the technology described herein coupled to a host 60. FIG. 6 is adapted from FIG. 1 of Ban, U.S. Pat. No. 5,404,485, which patent is incorporated by reference for all purposes as if fully set forth herein. Flash memory device 50 includes a flash memory 54, a controller 52 and a random access memory (RAM) 56. Controller 52, that corresponds to "flash control 14" of U.S. Pat. No. 5,404,485, manages flash memory 54, with the help of RAM 56, as described in U.S. Pat. No. 5,404,485. Flash memory 54 encodes data, two or more bits per cell of flash memory 54, as described in U.S. Pat. No. 6,522,580 or in U.S. Pat. No. 6,643,188. Controller 52 also performs ECC encoding and decoding and non-bijective mapping and demapping as described above.

Figure 7:
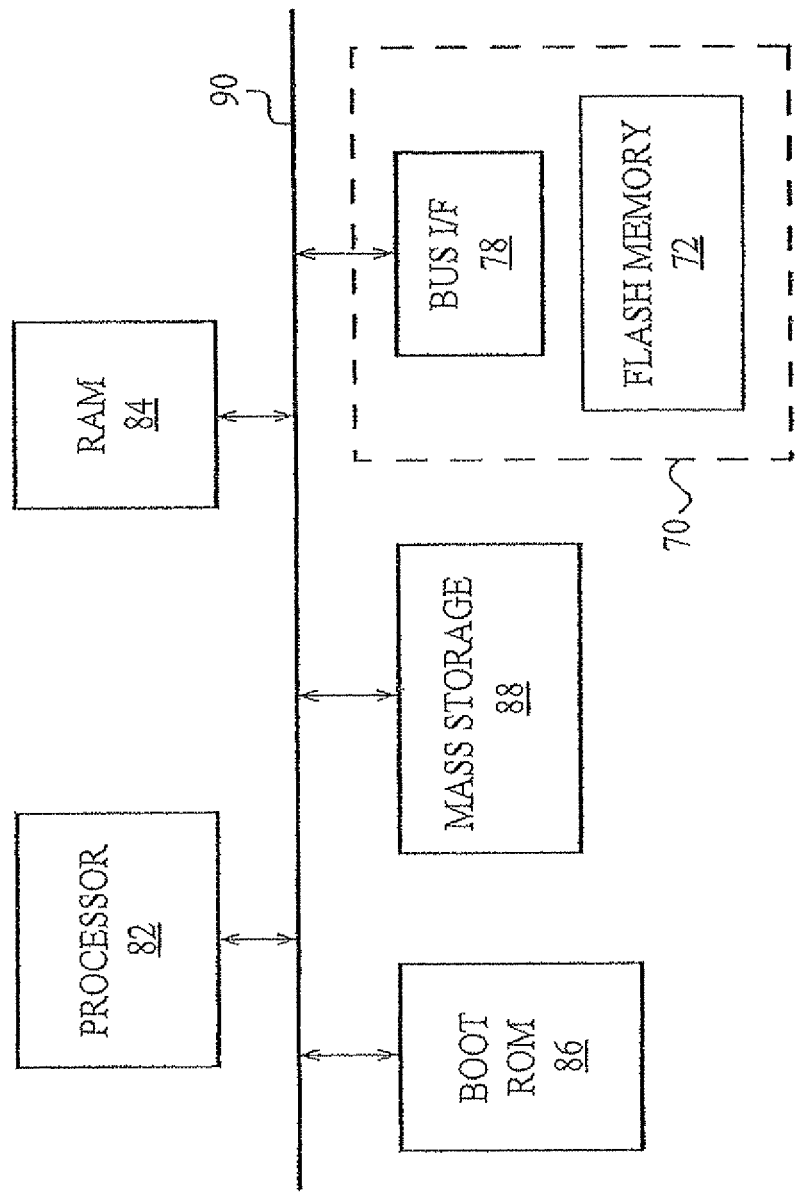
FIG. 7 is a high-level partial block diagram of a data storage system.

FIG. 7 is a high-level partial block diagram of an alternative data storage system 80 of the technology described herein. Data storage system 80 includes a processor 82 and four memory devices: a RAM 84, a boot ROM 86, a mass storage device (hard disk) 88 and a flash memory device 70, all communicating via a common bus 90. Like flash memory device 50, flash memory device 70 includes a flash memory 72. Unlike flash memory device 50, flash memory device 70 lacks its own controller and RAM. Instead, processor 82 emulates controller 52 by executing a software driver that implements the methodology of U.S. Pat. No. 5,404,485 in the manner e.g. of the TrueFFS™ driver of msystems Ltd. of Kfar Saba, Israel. Flash memory 72 encodes data, two or more bits per cell of flash memory 72, as described in U.S. Pat. No. 6,522,580 or in U.S. Pat. No. 6,643,188. Processor 82 also performs ECC encoding and decoding and non-bijective mapping and demapping as described above. Flash memory device 70 also includes a bus interface 78 to enable processor 82 to communicate with flash memory 72.

The ECC codes of the technology described herein may be either "systematic" or "non-systematic". Systematic error correction coding is characterized by the fact that the original data bits are preserved by the encoding process and can be identified within the bits stored. In other words, the error correction mechanism takes the original data bits, adds to them some parity bits, and stores both data bits and parity bits. Later, when reading the stored bits, both the data bits and the parity bits are read, and the parity bits enable the correction of errors in the read data bits, thus generating the original data bits.

In nonsystematic error correction codes the original data bits are not preserved and are not stored. Instead, the encoding process transforms the original data bits into a larger group of bits, sometimes called "protected data bits", that are the ones stored. Like the union of data bits and the associated parity bits of a systematic error code, the protected data bits of a non-systematic error code are considered herein to be the codeword corresponding to the original data bits. When reading the stored protected data bits the original data bits are re-generated, even if there are errors in the protected data bits. The defining characteristic of non-systematic codes is that there is no direct correspondence between a specific original data bit and a specific stored bit. An original data bit is "scattered" in multiple stored bits, and only the combination of those multiple stored bits tells the value of the original bit.

The code of the software driver that processor 82 executes to manage flash memory 72 is stored in mass storage device 88 and is transferred to RAM 84 for execution. Mass storage device 88 thus is an example of a computer-readable code storage medium in which is embedded computer readable code for managing flash memory 72 according to the principles of the technology described herein.

[The New Material Starts Here]

It was noted above that it may be useful to store "random" data with non-uniform occupancies of the programming voltage levels of the flash cells, and that one way of achieving such non-uniform occupancies is to store some redundant bits along with the information bits. This is not the only way to achieve non-uniform occupancies. For example, the mapping function of Table 2 automatically stores "random" data (or, more precisely, "uniformly distributed" data, i.e., data in which each of the four bit sequences "0 0", "0 1", "1 1" and "1 0" appears the same number of times) with non-uniform occupancies of the three programming voltage levels. Specifically, the third voltage level is occupied twice as often as either of the other two voltage levels.

The following notation now is introduced to formalize the discussion of relative voltage level occupancies. The voltage level distribution of a set of programmed flash cells is a vector, each of whose elements is the fraction of the cells that have been programmed to the corresponding voltage level. (In the above discussion of Tables 2 and 4, the voltage level distribution was called the "probability distribution".) For example, if ten single-bit-per-cell flash memory cells are programmed according to the mapping function

| Bit Sequence | Voltage Level |
|---|---|
| 1 | 0 |
| 0 | 1 | to store the bit string "1111110000", the resulting voltage level distribution is (0.6, 0.4).

Every mapping function has associated therewith one or more "native" voltage level distributions, which is/are the voltage level distribution(s) for storing uniformly distributed data. A mapping function that is bijective (one-to-one and onto) has a single native voltage level distribution. For example, the mapping function of Table 1 has the single native voltage level distribution (0.25, 0.25, 0.25, 0.25). A mapping function that is not one-to-one or that is not onto has several native voltage level distributions. One native voltage level distribution is the native voltage level distribution for the mapping function as written. The other native voltage level distribution(s) is/are (the) native voltage level distribution(s) for (the) equivalent mapping function(s) with trivial re-orderings of the voltage levels. For example, the mapping function of Table 2 has a native voltage level distribution (0.25, 0.25, 0.5) as written and two other native voltage level distributions, (0.25, 0.5, 0.25) that is the native voltage level distribution of the mapping function

| Bit Sequence | Voltage Level |
|---|---|
| 0 0 | 0 |
| 1 1 | 1 |
| 1 0 | 1 |
| 0 1 | 2 | as written, and (0.5, 0.25, 0.25) that is the native voltage level distribution of the mapping function

| Bit Sequence | Voltage Level |
|---|---|
| 1 1 | 0 |
| 1 0 | 0 |
| 0 0 | 1 |
| 0 1 | 2 | as written. Similarly, the mapping function of Table 6 has a native voltage level distribution (0.375, 0.25, 0.375) as written and two other native voltage level distributions: (0.375, 0.375, 0.25) and (0.25, 0.375, 0.375).

Note that the voltage level distribution of specific data that are stored according to a certain mapping function generally is not exactly equal to the native voltage level distribution of the mapping function. For example, if the mapping function

| Bit Sequence | Voltage Level |
|---|---|
| 1 | 0 |
| 0 | 1 | is used to store the bit string "1111110000", the resulting voltage level distribution is (0.6, 0.4) and not the (0.5, 0.5) native voltage level distribution of the mapping function. Not even the voltage level distribution of random data that are stored according to a certain mapping function is the native voltage level distribution of the mapping function unless the random data are uniformly distributed; but the longer the random data the more likely is its voltage level distribution to be very close or identical to the native voltage level distribution of the mapping function.

It now will be demonstrated how to transform input data bits in a manner that enables storing uniformly distributed input data, in a sufficiently large number of flash memory cells, with any desired voltage level distribution (or, more accurately, how to approach the desired voltage level distribution with any desired degree of accuracy). This capability is useful e.g. for extending the useful lifetime of a flash memory by reducing the frequency with which the cells of the memory are programmed to relatively high voltage levels. The specific bijective mapping function for which the technique will be demonstrated is the mapping function of Table 1. It will be clear to those skilled in the art how to apply the technique to other mapping functions, whether bijective or not bijective.

The heart of the technique is a reverse Huffman encoding of the input data bits as a string of transformed data bits. The transformed data bits are the bits that are actually programmed into the flash memory cells using the mapping function of Table 1. The reverse Huffman encoding is such that uniformly distributed input data bits are encoded as transformed data bits whose voltage level distribution approximates the desired voltage level distribution.

In the following example, the target voltage level distribution is (3/8, 5/16, 3/16, 1/8). A sequence of reverse Huffman encodings is constructed whose respective voltage level distributions converge to the target voltage level distribution. The n-th reverse Huffman encoding of the sequence uses n four-level flash cells. The construction stops at the value of n that provides a sufficiently close approximation to the target voltage level distribution.

Figure 9:
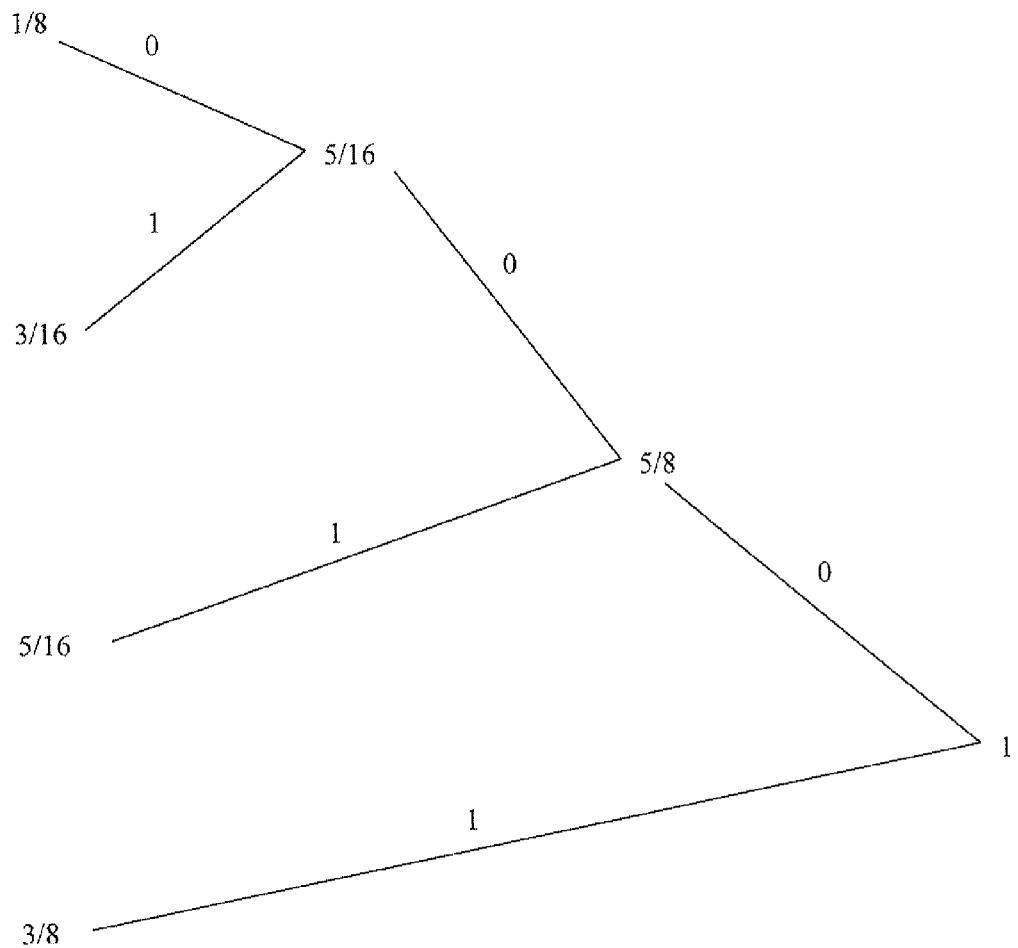
FIGS. 9 and 10 are reverse Huffman encoding trees for approximating the target voltage level distribution (⅜, 5/16, 3/16, ⅛) for the mapping function of Table 1.

FIG. 9 shows the reverse Huffman tree for n=1. The four leaves of the tree, on the left side of the tree, correspond to the four voltage levels of a single cell and are labeled top-down with the corresponding target fractional occupancies. The branches of the tree are constructed, top down and left to right, by joining existing nodes. Each node, other than the leaves and the root node, has two branches to its left and one branch to its right. The leaves have only single branches to their right. The root node has only two branches to its left. Each node, other than the leaves, is labeled by the sum of the labels of the two nodes to which it is connected by the branches to its left. In extending the tree by constructing a branch to the right of an existing node, if the branch could go up to the right or down to the right, the direction that is chosen is determined by the label of the resulting node: the direction that gives the lower label is chosen. In case of a tie, both trees are constructed and the tree that gives the better approximation to the target voltage level distribution is the tree that is used. Finally, branches that go up to the right are labeled with "1" bits and branches that go down to the right are labeled with "0" bits.

Figure 9A:
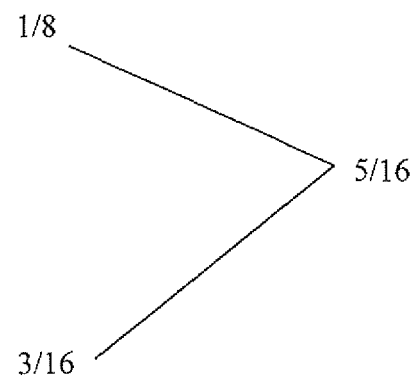
FIGS. 9A-9C show intermediate steps in the construction of the reverse Huffman encoding tree of FIG. 9.
Figure 9B:
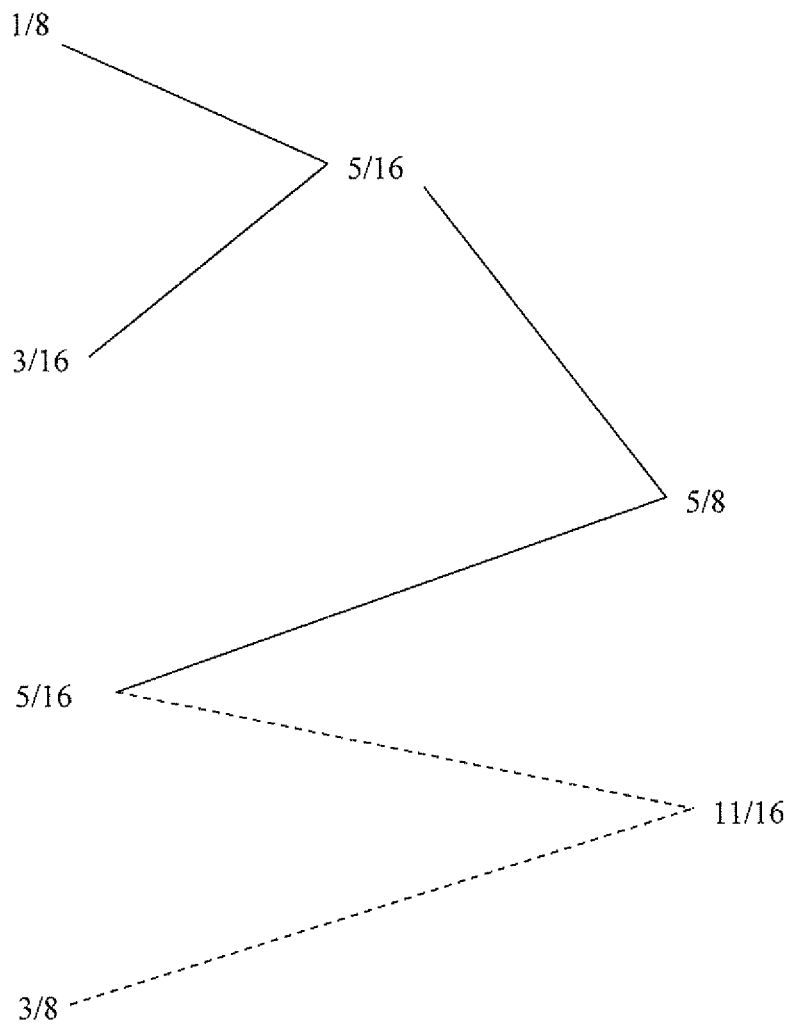
Figure 9C:
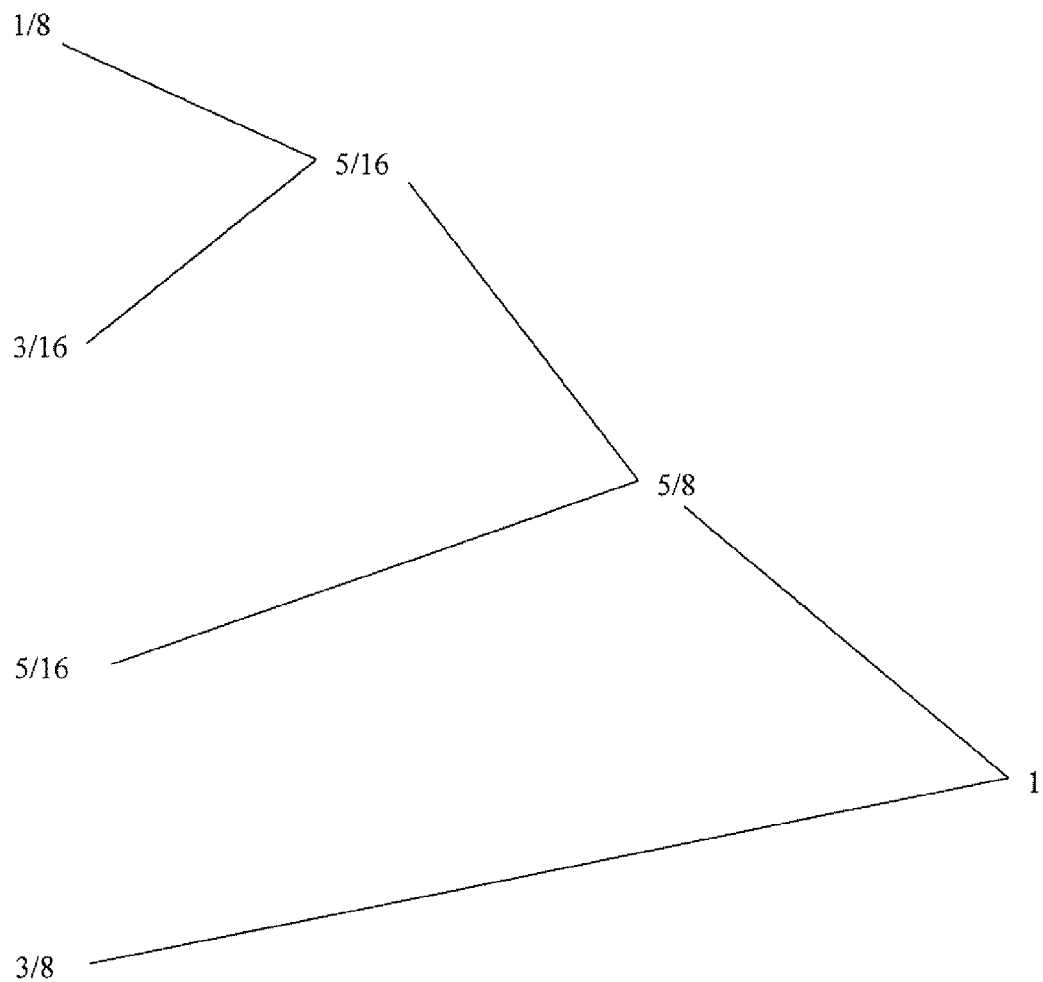

The three stages in the construction of the tree of FIG. 9 are shown in FIGS. 9A-9C. In FIG. 9A, the top two leaves are connected (this is the only way to connect the two leaves) to give the first intermediate node. In FIG. 9B, a branch from the third leaf down could be constructed up to a node that is connected to the first intermediate node and that is labeled by 5/16+5/16=5/8 or down to a node that is connected to the bottom leaf and that is labeled by 5/16+3/8=11/16. 11/16>5/8 so the upward construction is selected. In FIG. 9C the second intermediate node is connected to the bottom leaf.

The input bit sequences of the encoding now are read from the tree starting from the root node and going bottom to top and right to left. The first input bit sequence is the label of the branch from the root node to the lowest leaf, "1". The second input bit sequence is the concatenation of the labels of the path from the root node to the second leaf up: "01". The third input bit sequence is the concatenation of the labels of the path from the root node to the third leaf up: "001". The fourth input bit sequence is the concatenation of the labels of the path from the root node to the top leaf: "000". The encoding itself is a mapping from the input bit sequences to the corresponding bit sequences of Table 1:

| Input Bit Sequence | Transformed Bit Sequence |
|---|---|
| 1 | 00 |
| 01 | 01 |
| 001 | 11 |
| 000 | 10 |

For example, this encoding transforms the input bit string "11011001" into the transformed bit string "0000010011". The corresponding voltage level distribution is (1/2, 1/4, 1/8, 1/8).

The labeling of branches of the reverse Huffman tree that go up to the right with "1" and of the branches of the reverse Huffman tree that go down to the right with "0" is an arbitrary convention. The opposite convention also works. In the case of the reverse Huffman tree of FIG. 9, using the opposite convention gives the following encoding:

| Input Bit Sequence | Transformed Bit Sequence |
|---|---|
| 0 | 00 |
| 10 | 01 |
| 110 | 11 |
| 111 | 10 | which also has the voltage level distribution (1/2, 1/4, 1/8, 1/8).

Figure 10:
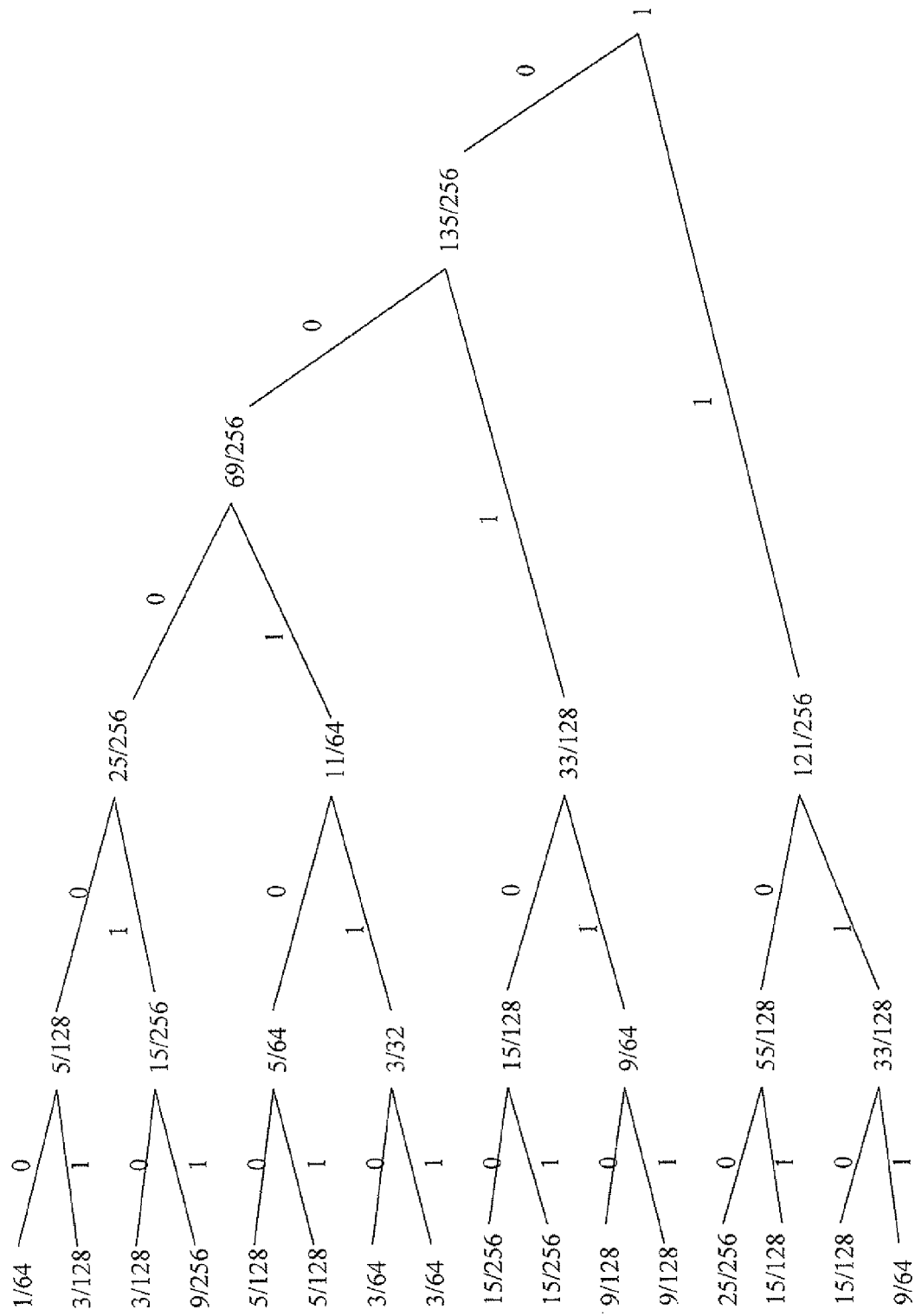

FIG. 10 shows the reverse Huffman tree for n=2. The sixteen leaves correspond to the sixteen ways of pairing the voltage levels of two cells, and are labeled by the products of the target fractional occupancies of the corresponding voltage levels, which are the target fractional occupancies of the corresponding voltage level pairs. The corresponding encoding is

| Input Bit Sequence | Transformed Bit Sequence |
|---|---|
| 111 | 0000 |
| 110 | 0001 |
| 101 | 0100 |
| 100 | 0101 |
| 0111 | 0011 |
| 0110 | 1100 |
| 0101 | 0111 |
| 0100 | 1101 |
| 00111 | 0010 |
| 00110 | 1000 |
| 00101 | 0110 |
| 00100 | 1001 |
| 00011 | 1111 |
| 00010 | 1110 |
| 00001 | 1011 |
| 00000 | 1010 |

The corresponding voltage level distribution is ($11/32$, $11/32$, $3/16$, $1/8$) which is closer to the target voltage level distribution than the n=1 voltage level distribution.

If it is desired to approach the target voltage level distribution even more closely, reverse Huffman encodings with n=3, 4, etc. are constructed. The leaves of the n-th tree are labeled with the $4^n$ possible n-fold products of the target fractional occupancies.

The target voltage level distribution of the above example was chosen to be biased downwards (i.e., biased towards lower voltage levels) than the native voltage level distribution of the mapping function of Table 1. The formal definition of such a downward bias is in terms of the norm of another vector, the vector that is obtained by multiplying each element of a voltage level distribution vector by the index of the corresponding voltage level. For example, the norm vector of the native voltage level distribution of the mapping function of Table 1 is (0, 0.25, 0.5, 0.75) and the norm vector of the target voltage level distribution of the above example is (0, 0.3125, 0.375, 0.375). The formal definition of a "downwardly biased" voltage level distribution, for a given norm and a given mapping function, is that a voltage level distribution is biased downward if the norm of the voltage level distribution is lower than the norm of any of the native voltage level distributions of the mapping function. Any norm may be used that satisfies the mathematical definition of the norm of a vector: the norm $\|x\|$ of a vector x is a non-negative scalar function of x that has the following two properties:

$\|x\|$ is multiplicative: if a is a scalar then $\|ax\|=a\|x\|$

The triangle inequality: for any two vectors x and y, $\|x+y\| \le \|x\|+\|y\|$

One popular set of norms is the p-norms, defined by $$\|x\|_p = \left(\sum_i |x_i|^p\right)^{1/p}$$

Popular special cases include the Euclidean norm (p=2), also known as the $L_2$ norm; the $L_1$ norm (p=1); and the $L_\infty$ norm (p=∞), $$\|x\|_\infty = \max_i \{|x_i|\}.$$

For the native and target voltage level distributions of the above example, these norms are

|  | Native | Target |
|---|---|---|
| $L_2$ norm | 0.9354 | 0.4098 |
| $L_1$ norm | 1.5 | 0.6875 |
| $L_\infty$ norm | 0.75 | 0.3125 |

Downward biasing is most useful in connection with bijective mapping functions such as the mapping function of Table 1.

Normally, data are written to flash memory devices in units called "pages". Typically, the cells of a flash memory are organized into units called "word lines" that are read and programmed simultaneously, with the word lines being organized into units called "blocks" that are erased simultaneously. Each word line includes a number of cells that corresponds to an integral number of pages. If the cells are multi-bit cells, each page is stored using bits of a common significance. For example, a word line of cells programmed according to the mapping function of Table 1 could be programmed with one page of input data in the most significant bits and another page of data in the least significant bits.

It is possible to program two or more pages into the same word-line of multi-bit cells with any desired voltage level distribution even if the pages are programmed separately at different times. How this is done now will be demonstrated. The description requires the definition of a specific kind of partial mapping of bit sequences to voltage level, a "pre-mapping".

A pre-mapping, relative to a mapping function from bit sequences to voltage levels, is a mapping, of only the bits in (a) selected position(s) in the bit sequences, to to voltage levels, that allows the full mapping function to be achieved later when it comes time to program the rest of the bits. The mapping function of Table 1 has two pre-mappings.

The first pre-mapping is obtained by selecting the most significant bits and ignoring the least significant bits:

TABLE 8

| Bit Sequence | Voltage Level |
|---|---|
| 0 x | 0* |
| 1 x | 2* |

The asterisks mean that the voltage levels that are indexed are not necessarily the same as the voltage levels that are indexed by indices "0" and "2" in the full mapping function, but rather are voltage levels that are the same as or lower than voltage levels 0 and 2 of the full mapping function. For example, voltage level 2* could be voltage level 2 of the full mapping function, voltage level 1 of the full mapping function, or a voltage level between voltage levels 1 and 2 of the full mapping function. Usually, voltage level 0 of the full mapping function is the erased voltage level of the cell, so that voltage levels 0 and 0* are identical, but in a flash memory in which all programmed voltage levels are higher than the erased voltage level it is possible for voltage levels 0 and 0* to not be identical.

The special case of voltage level 0*=voltage level 0=erased voltage level and voltage level 2*=voltage level 2 now will be explained in more detail. The first pre-mapping of the mapping function of Table 1 is for programming the page of most significant bits of a two-bit-per-cell word line before programming the page of least significant bits of the word line.

When the page of most significant bits is programmed, cells that are to store "0" most significant bits are left in their erased state and cells that are to store "1" most significant bits are programmed to voltage level 2. When the page of least significant bits is programmed, cells that are to store "0" least significant bits and that already store "0" most significant bits are left in their erased state, cells that are to store "0" least significant bits and that already store "1" significant bits are promoted from voltage level 2 to voltage level 3, cells that are to store "1" least significant bits and that already store "0" most significant bits are promoted from voltage level 0 to voltage level 1, and cells that are to store "1" least significant bits and that already store "1" most significant bits are left at voltage level 2.

The second pre-mapping of the mapping function of Table 1 is obtained by selecting the least significant bits and ignoring the most significant bits:

TABLE 9

| Bit Sequence | Voltage Level |
|---|---|
| x 0 | 0* |
| x 1 | 1* |

A pre-mapping, relative to the mapping function of Table 2, for initially programming only most significant bits, is:

TABLE 10

| Bit Sequence | Voltage Level |
|---|---|
| 0 x | 0* |
| 1 x | 2* |

Mapping functions with n bits per bit sequence could in principle have up to $$\binom{n}{1}+\binom{n}{2}+\ldots+\binom{n}{n-1}=2^n-2$$

corresponding to the $2^n-2$ ways to select between 1 and n−1 out of n bit positions to ignore, but usually do not have that many pre-mappings. The mapping function of Table 6 has four pre-mappings if voltage level 0 is the erased voltage level. The first pre-mapping, that allows programming the most significant bits before programming the rest of the bits, is

TABLE 11

| Bit Sequence | Voltage Level |
|---|---|
| 0 x x | 0*, 0* |
| 1 x x | 1*, 0* |

The second pre-mapping, that allows programming the bits of middle significance before programming the rest of the bits, is

TABLE 12

| Bit Sequence | Voltage Level |
|---|---|
| x 0 x | 0*, 0* |
| x 1 x | 0*, 1* |

The third pre-mapping, that allows programming both the most significant bits and the bits of middle significance before programming the least significant bits, is

TABLE 13

| Bit Sequence | Voltage Level |
|---|---|
| 0 0 x | 0*, 0* |
| 0 1 x | 0*, 2* |
| 1 0 x | 1*, 0* |
| 1 1 x | 2*, 1* |

The fourth pre-mapping, that allows programming both the most significant bits and the least significant bits before programming the bits of middle significance, is

TABLE 14

| Bit Sequence | Voltage Level |
|---|---|
| 0 x 0 | 0*, 0* |
| 0 x 1 | 0*, 1* |
| 1 x 0 | 1*, 0* |
| 1 x 1 | 2*, 0* |

The other ways of selecting and ignoring bit positions are not amenable to pre-mappings that allow the full mapping function to be achieved later. For example, the mapping

| Bit Sequence | Voltage Level |
|---|---|
| x x 0 | 0* 0* |
| x x 1 | 0* 1* | does not allow subsequent programming to the bit sequence "1 0 1" (voltage levels 2, 0).

Note that when n is greater than 2 the various pre-mappings may not be mutually exclusive. For example, a typical way to program the three pages of a three-bit-per-cell word line at three different times is to program the first page (of most significant bits) first according to the pre-mapping of Table 11, to program the second page (of bits of middle significance) second according to the pre-mapping of Table 12, and finally to program the third page (of least significant bits) according to the mapping function of Table 6.

The definition of "native voltage level distribution" for a pre-mapping is analogous to the definition of "native voltage level distribution: for a full mapping function. For example, the pre-mapping of Table 8 has only one native voltage level distribution, (0.5, 0, 0.5, 0) and the pre-mapping of Table 9 also has only one native voltage level distribution, (0.5, 0.5, 0, 0).

In general, it is not possible to obtain an arbitrary non-native target voltage level distribution if pages are programmed separately. The accessible final non-native voltage distributions are convolutions of separate voltage level distributions of the separate pages, or possibly of pages that are programmed together in the case of mapping functions with more than two bits per bit sequence. For example, using the mapping function of Table 1 and the pre-mapping of Table 8, the page to be programmed (first) as most significant bits could be transformed by a reverse Huffman encoding that would turn input data with equal numbers of "0"s and "1"s into data with more "0"s than "1"s (say a fraction α of "0"s and a fraction 1−α of "1"s, where α>0.5). Programming the word line to store those uniformly distributed input bits, after the reverse Huffman encoding and according to the pre-mapping of Table 9, would set the voltage level distribution of the cells of the word line so that the to fractional occupancy of state 0* is α and the fractional occupancy of state 2* is 1−α. Note that this voltage level distribution is different from the native voltage level distribution of Table 8. The page to be programmed (later) as least significant bits could be transformed by a different reverse Huffman encoding, say a fraction β of "0"s and a fraction 1−β of "1"s, where β>0.5. After both pages have been programmed, the final overall voltage level distribution of the cells of the word line would be (αβ, α(1−β), (1−α)(1−β), (1−α)β), which is not the native voltage level distribution of the mapping function of Table 1. Note the following two special cases: not applying reverse Huffman encoding to the most significant bits results in a final overall voltage distribution of (β/2, (1−β)/2, (1−β)/2, β/2); not applying reverse Huffman encoding to the least significant bits results in a final overall voltage distribution of (α/2, α/2, (1−α)/2, (1−α)/2).

Pre-mapping also is useful for programming data into a single flash cell according to a non-injective mapping function similar to the mapping function of Table 2 but with many more voltage levels, with one voltage level distribution for the data initially programmed and another voltage level distribution (generally one of the native voltage level distributions) after all the data has been programmed.

Non-injective mapping also may be used to obtain (at least in principle) arbitrary voltage level distributions without reverse Huffman encoding. For example, the following non-injective mapping has the target voltage level distribution (3/8, 5/16, 3/16, 1/8) as its native voltage level distribution:

| Bit Sequence | Voltage Level |
|---|---|
| 0 0 0 0 | 0 |
| 0 0 0 1 | 0 |
| 0 0 1 1 | 0 |
| 0 0 1 0 | 0 |
| 0 1 1 0 | 0 |
| 0 1 1 1 | 0 |
| 0 1 0 1 | 3 |
| 0 1 0 0 | 3 |
| 1 1 0 0 | 1 |
| 1 1 0 1 | 1 |
| 1 1 1 1 | 1 |
| 1 1 1 0 | 1 |
| 1 0 1 0 | 1 |
| 1 0 1 1 | 2 |
| 1 0 0 1 | 2 |
| 1 0 0 0 | 2 |

Because this mapping function is not injective, it is necessary to apply ECC encoding to the input bits to be programmed before applying the mapping function, so that the ambiguity of the mapping function can be resolved when the stored bits are read from the flash memory. For example, even if the bits are stored and read with no errors, only the most significant bit is read unambiguously in all cases (read voltage level 0 or 3 means most significant bit is "0"; read voltage level 1 or 2 means most significant bit is "1"). The second bit is ambiguous if the read voltage level is 0 or 1. The third bit is ambiguous if the read voltage level is 0, 1 or 2. The least significant bit always is ambiguous. ECC is needed to resolve these ambiguities. Clearly, if the bit sequences are made sufficiently long, any target voltage level distribution can be approximated with arbitrary precision, because n-bit-long sequences are associated with native voltage level distributions whose vector elements have $2^n$ as their denominator, but this flexibility is achieved at the cost of having to use a correspondingly longer and stronger ECC to resolve the increasingly severe ambiguities associated with larger and larger values of n. Also note that if the number of information bits per cell (k) remains constant while the number of encoded bits per cell (n) increases, then the number of redundant bits per cell (n-k) also increases. This means that the increased ambiguity in reading the cell is compensated by the increased redundancy.

FIGS. 6 and 7 also serve to illustrate a flash memory device and a data storage system for storing input data with arbitrary voltage level distributions, as described above. In the case of the data storage system, mass storage device 88 is an example of a computer-readable code storage medium in which is embedded computer-readable code for storing input data in flash memory 72 with arbitrary voltage level distributions. Other examples of such mass storage device include CDs, DVDs and flash disks.

A limited number of embodiments of methods for programming one or more cells of a flash memory, and of a device and system that use the methods, have been described. It will be appreciated that many variations, modifications and other applications of the methods, device and system may be made.

Annex A: Flash Capacity Computation

Let X denote the programming voltage level. Let Y denote the read voltage level. Let P(X) denote the probability of programming voltage level X. Let P(Y|X) denote the probability to read voltage level Y given that voltage level X was programmed. Then the flash capacity is given by $$C = \sum_{X,Y} P(X)P(Y \mid X)\log_2\left(\frac{P(Y \mid X)}{\sum_X P(X)P(Y \mid X)}\right)$$

Two examples for computing the capacity of a flash memory are provided next.

Example 1

Computing the Capacity of Flash Memory 10 of FIG. 4

The programming and read voltage levels are: X=Y=[0 0.333 0.666 1] [Volts],

The flash memory suffers from an additive Gaussian noise with standard deviation σ=150 [mV], Each programming level is programmed with equal probability:

$P(X_i)$=0.25 for i=1, 2, 3, 4

The transition probabilities are computed as follows:

$$P(Y_j \mid X_i) = Q\left(\frac{|Y_j - X_i| - 0.1667}{\sigma}\right) - Q\left(\frac{|Y_j - X_i| + 0.1667}{\sigma}\right)$$

for $j = 2, 3$ $$P(Y_j \mid X_i) = Q\left(\frac{|Y_j - X_i| - 0.1667}{\sigma}\right) \text{ for } j = 1, 4$$

where, $Q(x) = \int_x^\infty \frac{1}{\sqrt{2\pi}} e^{-x^2/2}$

Then the flash capacity is given by:

$$C = \sum_{i=1}^{4}\sum_{j=1}^{4} P(X_i)P(Y_j|X_i)\log_2\left(\frac{P(Y_j|X_i)}{\sum_{k=1}^{4} P(X_k)P(Y_j|X_k)}\right)$$
$$= 1.1612 IBPC$$

Example 2

Computing the Capacity of Flash Memory 110 of FIG. 5, Embodiment of Tables 4 and 5

The programming and read voltage levels are: X=Y=[0 0.5 1] [Volts],

The flash memory suffers from an additive Gaussian noise with standard deviation σ=150 [mV], The non-bijective mapping induces the following non-uniform distribution over the programming voltage levels: P(X)=[0.375 0.25 0.375]

The transition probabilities are computed as follows:

$$P(Y_j|X_i) = Q\left(\frac{|Y_j - X_i| - 0.25}{\sigma}\right) - Q\left(\frac{|Y_j - X_i| + 0.25}{\sigma}\right)$$
for $j = 2$ $$P(Y_j|X_i) = Q\left(\frac{|Y_j - X_i| - 0.25}{\sigma}\right) \text{ for } j = 1, 3$$

Then the flash capacity is given by:

$$C = \sum_{i=1}^{4}\sum_{j=1}^{4} P(X_i)P(Y_j|X_i)\log_2\left(\frac{P(Y_j|X_i)}{\sum_{k=1}^{4} P(X_k)P(Y_j|X_k)}\right)$$
$$= 1.2224 IBPC$$

Annex B: Formal Function-Related Definitions

Definition (one-to-one): A function $f$ is said to be one-to-one (injective) if and only if $f(x)=f(y)$ implies x=y. Otherwise, the function is many-to-one: there exists at least one argument pair (x,y) such that x≠y and $f(x)=f(y)$.

Definition (onto): A function $f$ from a set A to a set B is said to be onto(surjective) if and only if for every element y of B there is an element x in A such that $f(x)=y$, that is, $f$ is onto if and only if $f(A)=B$. Otherwise, the function is into: there is at least one element y of B that is not mapped to by $f$.

Definition (bijection): A function is called a bijection, if the function is onto and one-to-one.

Annex C: Log-Likelihood Ratio (LLR) Computation

Let $f: 2^m \to [1, 2, \ldots, M]$ denote the mapping function, matching each length m binary sequences b to a programmed cell/s state X out of M possible states of the cell/s. Furthermore, let Y denote the read cell/s state. Then, the Log-Likelihood Ratio (LLR) for bit i is given by:

$$LLR_i(Y) = \log\left(\frac{Pr(b_i = 0 | Y)}{Pr(b_i = 1 | Y)}\right)$$

$$= \log\left(\frac{Pr(Y | b_i = 0)}{Pr(Y | b_i = 1)}\right)$$

$$= \log\left(\frac{\sum_{X \in X_i^0} Pr(Y|X)}{\sum_{X \in X_i^1} Pr(Y|X)}\right),$$

where $X_i^0 = \{X | \exists b \in b_i^0 \text{ such that } f(b)=X\}$, $X_i^1 = \{X | \exists b \in b_i^1 \text{ such that } f(b)=X\}$ and $b_i^0$, $b_i^1$ denote the sets of length m binary sequences with the i'th bit equal to 0 and 1 respectively. The probabilities Pr(Y|X) are computed as described in Annex A. Note that we assume that the bits have equal a-priori probabilities (i.e. a bit has equal probability to be 0 or 1).

Annex D: Coding Scheme Based on Single-Level Coding (SLC)

Reference: U. Wachsmann, R. F. H. Fischer and J. B. Huber, "Multilevel codes: theoretical concepts and practical design rules", *IEEE Transactions on Information Theory* vol. 45 no. 5 pp. 1361-1391 (1999)

In a single level coding scheme an information bit stream i is encoded using a single code. The coded bits are mapped to programming voltage levels of the flash memory. The read voltage levels are then decoded in order to recover the original information bit stream. Flash memory 10 of FIG. 4 and flash memory 110 of FIG. 5 use a single level coding scheme.

Let i denote the information bit stream stored in the flash memory. Let Y denote the sequence of read voltage levels. Furthermore, assume that every information bit stream has equal a-priori probability. Optimal Maximum-Likelihood (ML) decoding is given by:

$$\hat{i} = \underset{i}{\mathrm{argmax}}\, Pr(\underline{i}|\underline{Y}) = \underset{i}{\mathrm{argmax}}\, Pr(\underline{Y}|\underline{i}).$$

ML decoding usually incurs very high decoding complexity. Hence, it is very common to use suboptimal decoding algorithms. For example, Low complexity iterative decoding algorithms can perform very close to ML decoding. (Y. Nana, E. Sharon and S. Litsyn, "Improved decoding of LDPC coded modulations", *IEEE Communication Letters* vol. 10 no. 5 pp. 375-377 (2006))

Additional simplification of the decoding scheme can be obtained if the decoder does not operate directly on the read voltage levels but rather on "soft" estimates of the stored bits such as LLRs that are generated by a demapper. This scheme is not optimal because the demapper extracts only first order statistics of the stored bits and ignores statistical dependencies between bits that are mapped to the same cell state. Usually the performance loss is very small if generalized Gray mapping is used (G. Caire, G. Taricco and E. Biglieri, "Bit interleaved coded modulation". *IEEE Transactions on Information Theory* vol. 44 no. 3 pp. 927-946 (1998)).

Annex E: Coding Scheme Based on Multi-Level Coding (MLC) with Multi-Stage Decoding (MSD)

Reference: U. Wachsmann, R. F. H. Fischer and J. B. Huber, "Multilevel codes: theoretical, concepts and practical design rules", *IEEE Transactions on Information Theory* vol. 45 no. 5 pp. 1361-1391 (1999)

In this scheme the information bit stream is divided into m streams and each bit stream is encoded using a different code.

The m coded bit streams are then used by the mapper to produce a stream of programming voltage levels. Each m bits, one from each coded bit stream, are mapped to a programming voltage level.

Figure 8:
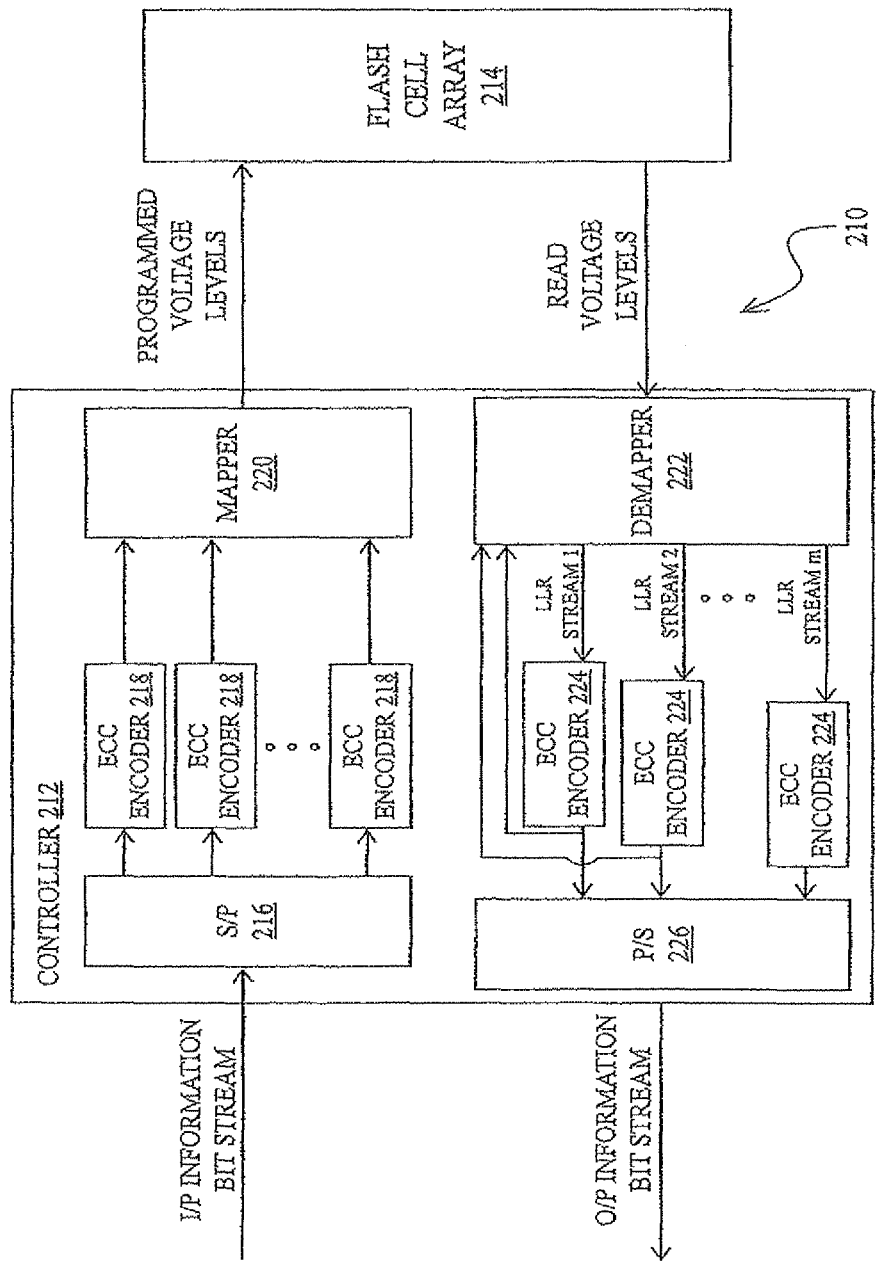
FIG. 8 is a simplified block diagram of a flash memory that uses multi-level coding and multi-stage decoding.

FIG. 8 is a simplified block diagram of a MLC/MSD flash memory 210, either of the conventional technology or according to the technology described herein. Flash memory 210 includes a MLC/MSD controller 212, and a flash memory cell array 214 that is identical to flash memory cell array 18 of FIGS. 4 and 5. Controller 212 includes a parallelizer (serial to parallel) 216 that parallelizes the incoming stream of information bits to m internal input bit streams, m ECC encoders 218 that encode respective internal input bit streams, a mapper 220 that maps the encoded bit streams to programmed voltage levels for programming flash cell array 214, a demapper for demapping read voltage levels to m internal output bit streams, m ECC decoders 224 that decode respective internal output bit streams as described below, and a serializer (parallel to serial) 226 that serializes the decoded bit streams.

When flash cell array 214 is read, decoding is performed in order to recover the stored information. Decoding is performed in stages. In each stage a single coded bit stream is decoded using respective "soft" decoder 224 that operates on "soft" bit estimates provided by demapper 222. The decoding result of each coded bit stream (except the m-th bit stream) is fed back to demapper 222 and is used by demapper in order to compute the "soft" bit estimates of the next coded bit stream, and so on until all m information bit streams are recovered.

The MLC/MSD scheme can use low complexity decoders that operate on the demapper output and not on the read voltage levels directly, while maintaining the optimality of the scheme. However MLC/MSD has several practical disadvantages. For example, MLC/MSD requires good knowledge of the flash memory's physical model in order to design the scheme and MLC/MSD is sensitive to imperfect knowledge of the physical model, i.e. MLC/MSD is less robust than the SLC scheme. Moreover, MLC/MSD suffers from error propagation between the different decoding stages, especially if the scheme is designed based on imperfect knowledge of the flash physical model. Furthermore, if the coding scheme is limited to a certain block size then the MLC/MSD scheme, that divides the information bit streams to several blocks, is based on an ECC that is shorter than the EEC of the SLC scheme. Because the performance of ECC improves as the code length increases, the MLC/MSD scheme suffers from inferior performance compared to the SLC scheme in practice.

What is claimed is:

1. A method of storing input data in a plurality of memory cells, comprising:
   (a) providing a mapping function of bit sequences to states of a physical parameter of the cells;
   (b) programming the plurality of memory cells, in accordance with the mapping function, to store the input data, in a way that stores uniformly distributed data with a programming state distribution other than any native state distribution of the mapping function; and
   (c) determining the programming state distribution by at least selecting a target state distribution, and devising a transformation so that the programming state distribution approximates the target state distribution within a predetermined tolerance.

2. The method of claim 1, wherein the physical parameter is a threshold voltage of the cells.

3. The method of claim 1, wherein the programming of the plurality of memory cells to store the input data includes:
   (i) transforming the input data into transformed data, using the transformation that transforms the uniformly distributed data into transformed uniformly distributed data stored, by programming a sufficiently large number of the memory cells in accordance with the mapping function, with the programming state distribution; and
   (ii) programming the plurality of memory cells to store the transformed data in accordance with the mapping function.

4. The method of claim 1, wherein the devising is effected using reverse Huffman encoding.

5. The method of claim 1, wherein the programming state distribution is biased downward relative to every native state distribution of the mapping function.

6. The method of claim 1, wherein the programming of the plurality of memory cells to store the input data includes:
   (i) programming the plurality of memory cells, in accordance with a pre-mapping relative to the mapping function, to store only a portion of the input data, in a way that stores a corresponding portion of the uniformly distributed data with a programming state distribution other than any native state distribution of the pre-mapping.

7. The method of claim 6, wherein the programming of the plurality of memory cells to store the input data further includes:
   (ii) programming the plurality of memory cells to store a remainder of the input data.

8. The method of claim 7, wherein the plurality of the memory cells are programmed to store the remainder of the input data in a way that would have resulted in the uniformly distributed data being stored with a native state distribution of the mapping function if the portion of the uniformly distributed data that corresponds to the only portion of the input data had been stored with a native state distribution of the pre-mapping.

9. The method of claim 7, wherein the plurality of the memory cells are programmed to store the remainder of the input data in a way that results in uniformly distributed data being stored with a programming state distribution other than any native state distribution of the mapping function if the portion of the uniformly distributed data that corresponds to the only portion of the input data had been stored with a native state distribution of the pre-mapping.

10. A memory device comprising:
    (a) a plurality of cells; and
    (b) a controller operative to store input data in the plurality of memory cells by programming the plurality of memory cells, in accordance with a mapping function of bit sequences to states of a physical parameter of the cells, to store the input data, in a way that stores uniformly distributed data with a programming state distribution other than any native state distribution of the mapping function, to determine the programming state distribution by at least selecting a target state distribution, and to devise a transformation so that the programming state distribution approximates the target state distribution within a predetermined tolerance.

11. A system for storing input data, comprising:
    (a) a memory device that includes a plurality of cells; and
    (b) a processor operative to store input data in the plurality of memory cells by programming the plurality of memory cells, in accordance with a mapping function of bit sequences to states of a physical parameter of the cells, to store the input data, in a way that stores uniformly distributed data with a programming state distribution other than any native state distribution of the mapping function, to determine the programming state distribution by at least selecting a target state distribution, and to devise a transformation so that the programming state distribution approximates the target state distribution within a predetermined tolerance.

12. A computer-readable storage medium having computer-readable code embodied in the computer-readable storage medium, the computer-readable code for storing input data in a plurality of memory cells, the computer-readable code comprising program code for programming the plurality of memory cells, in accordance with a mapping function of bit sequences to states of a physical parameter of the cells, to store the input data, in a way that stores uniformly distributed data with a programming state distribution other than any native state distribution of the mapping function, for determining the programming state distribution by at least selecting a target state distribution, and for devising a transformation so that the programming state distribution approximates the target state distribution within a predetermined tolerance.

* * * * *